(12) United States Patent
Hosono

(10) Patent No.: US 8,995,185 B2
(45) Date of Patent: Mar. 31, 2015

(54) SEMICONDUCTOR MEMORY DEVICE

(75) Inventor: Koji Hosono, Fujisawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 70 days.

(21) Appl. No.: 13/603,893

(22) Filed: Sep. 5, 2012

(65) Prior Publication Data

US 2013/0250683 A1 Sep. 26, 2013

(30) Foreign Application Priority Data

Mar. 22, 2012 (JP) ................................. 2012-065653

(51) Int. Cl.
*G11C 11/34* (2006.01)
*G11C 16/04* (2006.01)
*G11C 16/08* (2006.01)
*G11C 11/56* (2006.01)

(52) U.S. Cl.
CPC ............ *G11C 16/0483* (2013.01); *G11C 16/08* (2013.01); *G11C 11/5621* (2013.01); *G11C 11/5671* (2013.01)
USPC .................. 365/185.05; 365/63; 365/185.06; 365/185.11; 365/185.17; 365/185.18; 365/185.23; 365/185.29

(58) Field of Classification Search
USPC ............ 365/185.05, 185.06, 185.11, 185.13, 365/185.17, 185.23, 185.33
See application file for complete search history.

(56) References Cited

U.S. PATENT DOCUMENTS

| | | | |
|---|---|---|---|
| 7,672,163 B2 | 3/2010 | Miwa | |
| 7,852,675 B2 | 12/2010 | Maejima | |
| 8,169,826 B2 | 5/2012 | Hishida et al. | |
| 8,194,453 B2 | 6/2012 | Maejima | |
| 2009/0267128 A1 | 10/2009 | Maejima | |
| 2011/0013454 A1* | 1/2011 | Hishida et al. | ........... 365/185.11 |
| 2011/0019477 A1 | 1/2011 | Hashimoto et al. | |
| 2011/0175159 A1* | 7/2011 | Itagaki et al. | ................. 257/326 |

FOREIGN PATENT DOCUMENTS

| | | |
|---|---|---|
| JP | 2009-266280 | 11/2009 |
| JP | 2009-266944 | 11/2009 |
| JP | 2009-266945 | 11/2009 |
| JP | 2011-40706 | 2/2011 |
| JP | 2011-44222 | 3/2011 |

OTHER PUBLICATIONS

Takashi Maeda, et al., "Multi-stacked 1G cell/layer Pipe-shaped BiCS Flash Memory" 2009 Symposium on VLSI Circuits Digest of Technical Papers, Jun. 2009, pp. 22-23 with cover pages.

* cited by examiner

*Primary Examiner* — Fernando Hidalgo
(74) *Attorney, Agent, or Firm* — Oblon, McClelland, Maier & Neustadt, L.L.P.

(57) ABSTRACT

According to one embodiment, a semiconductor memory device includes memory units each includes a first transistor, memory cell transistors, and a second transistor serially coupled between first and second ends. A memory cell transistor of each memory unit has its gate electrode coupled to each other. A bit line is coupled to the first ends. First and second drivers output voltage applied to selected and unselected first transistors, respectively. Third and fourth drivers output voltage applied to selected and unselected second transistors, respectively. A selector couples the gate electrode of the first transistor of each memory unit to the first or second driver, and that of the second transistor of each memory unit to the third or fourth driver.

11 Claims, 19 Drawing Sheets

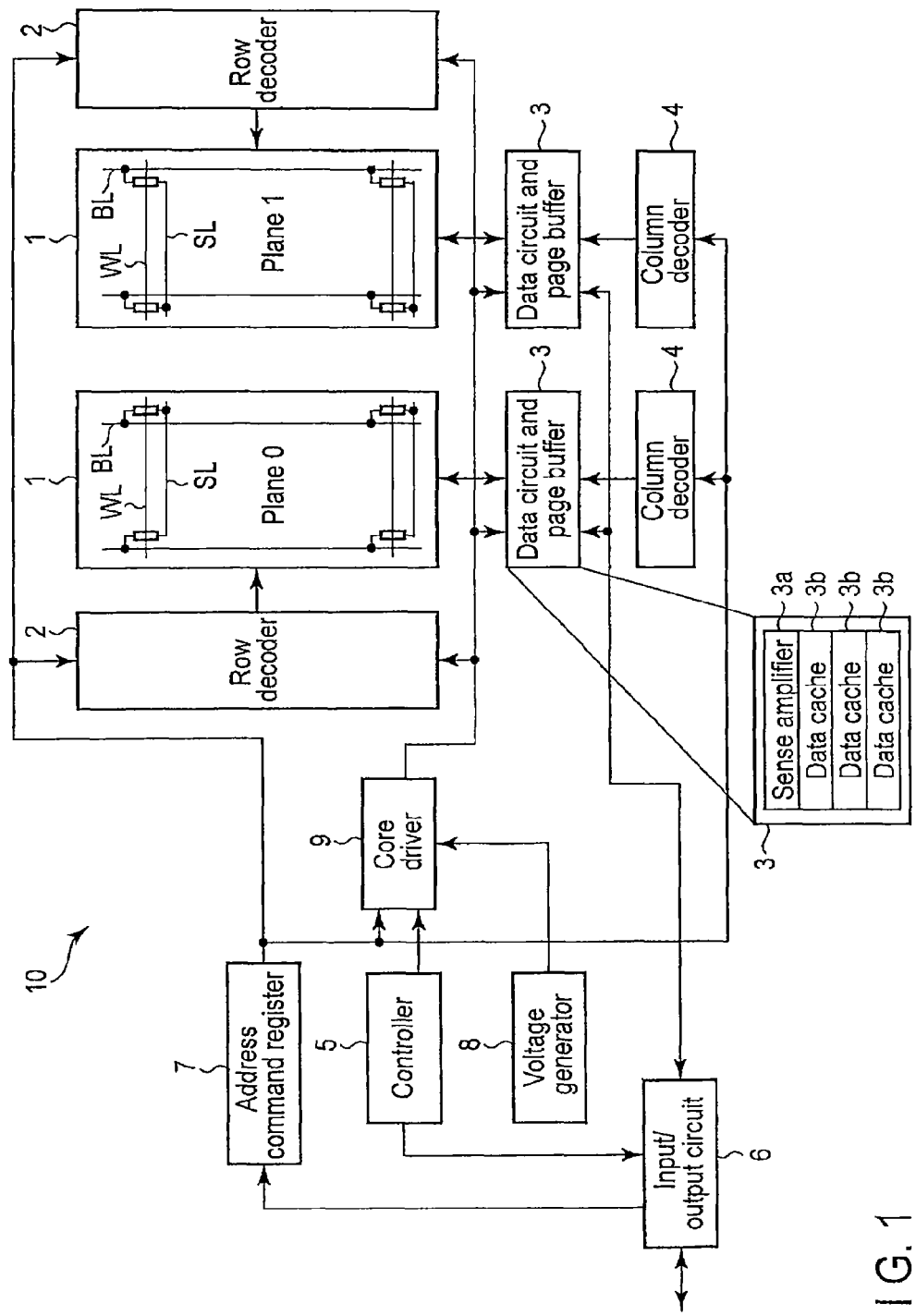
F I G. 1

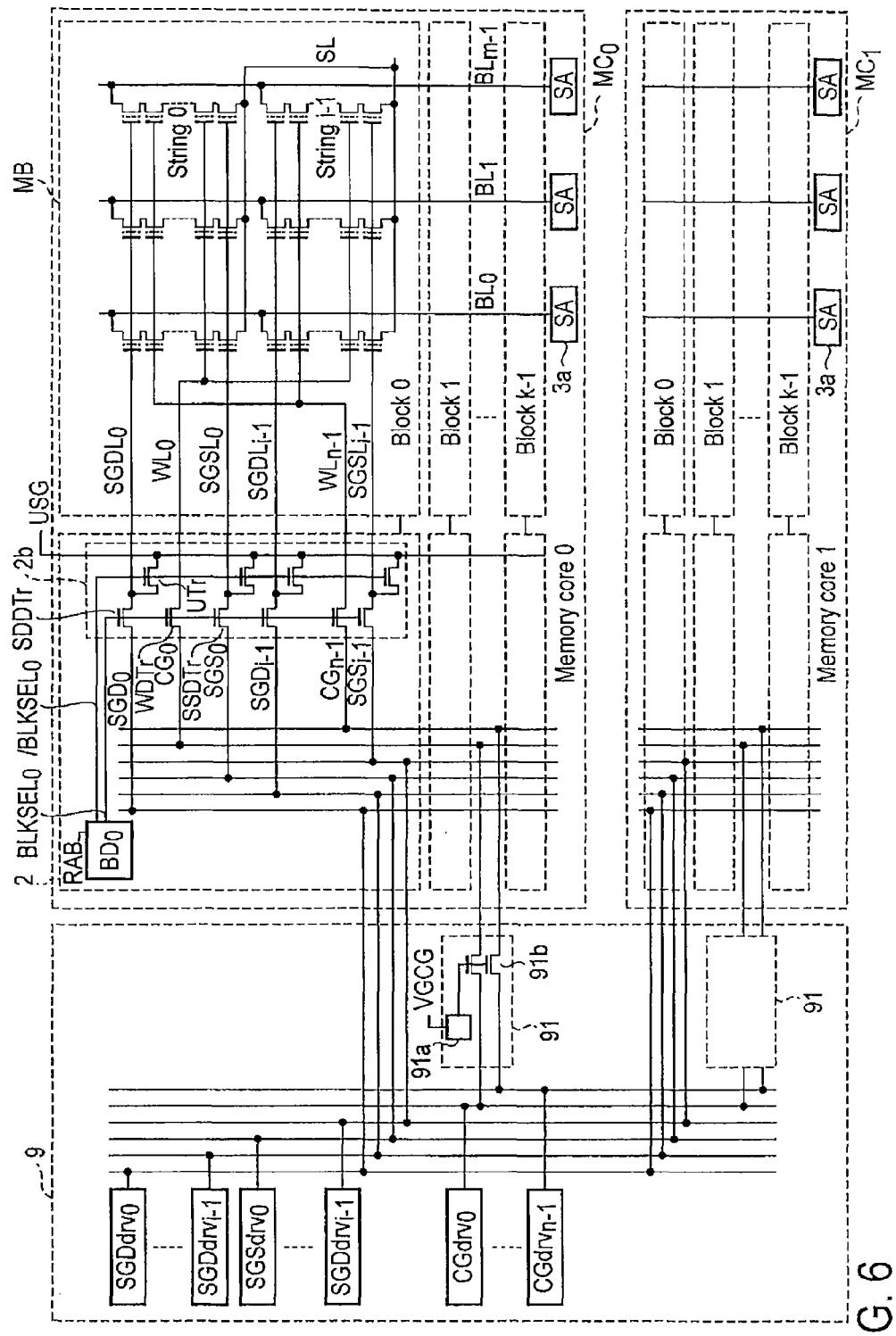
F I G. 6

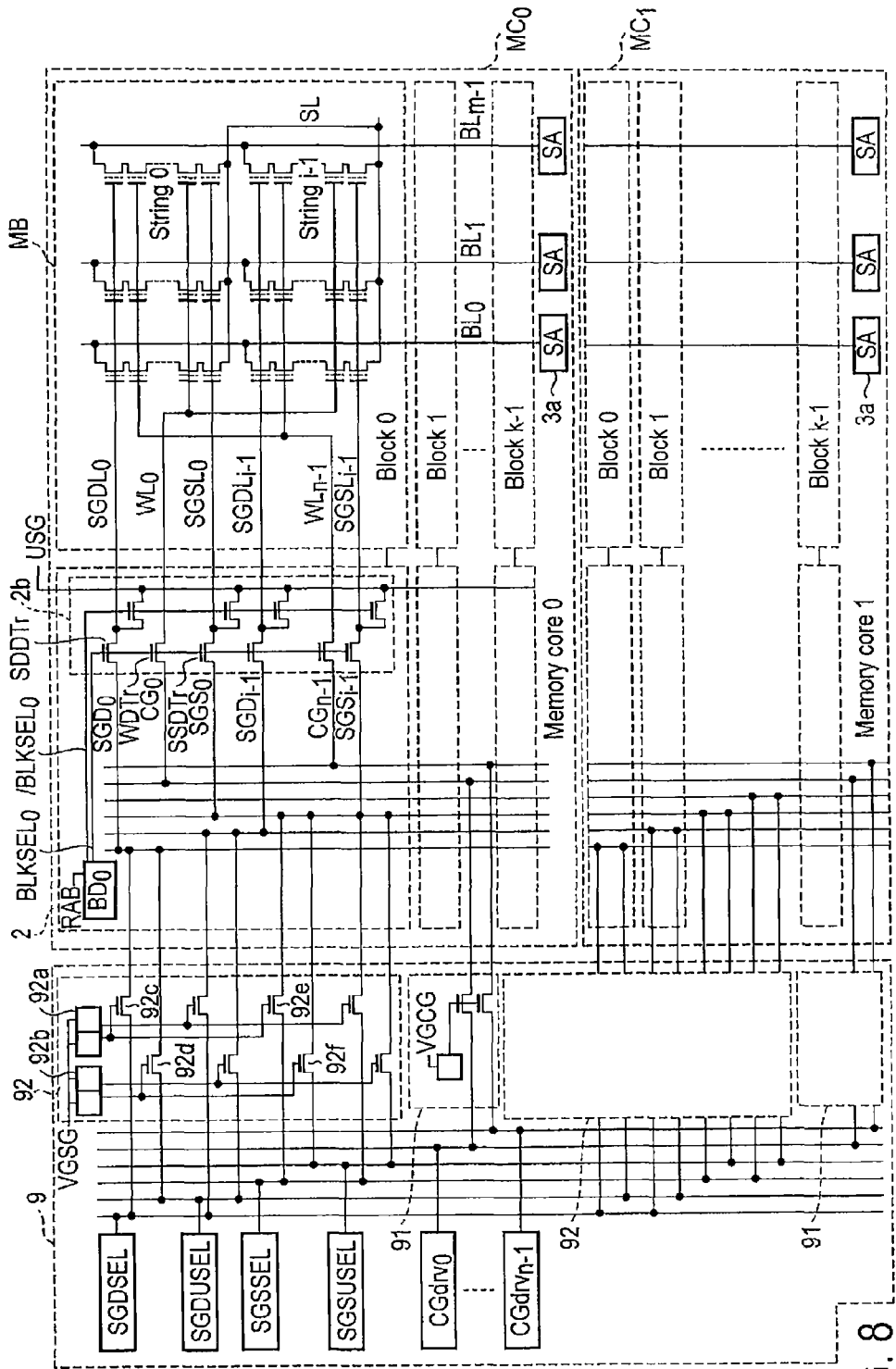
F I G. 8

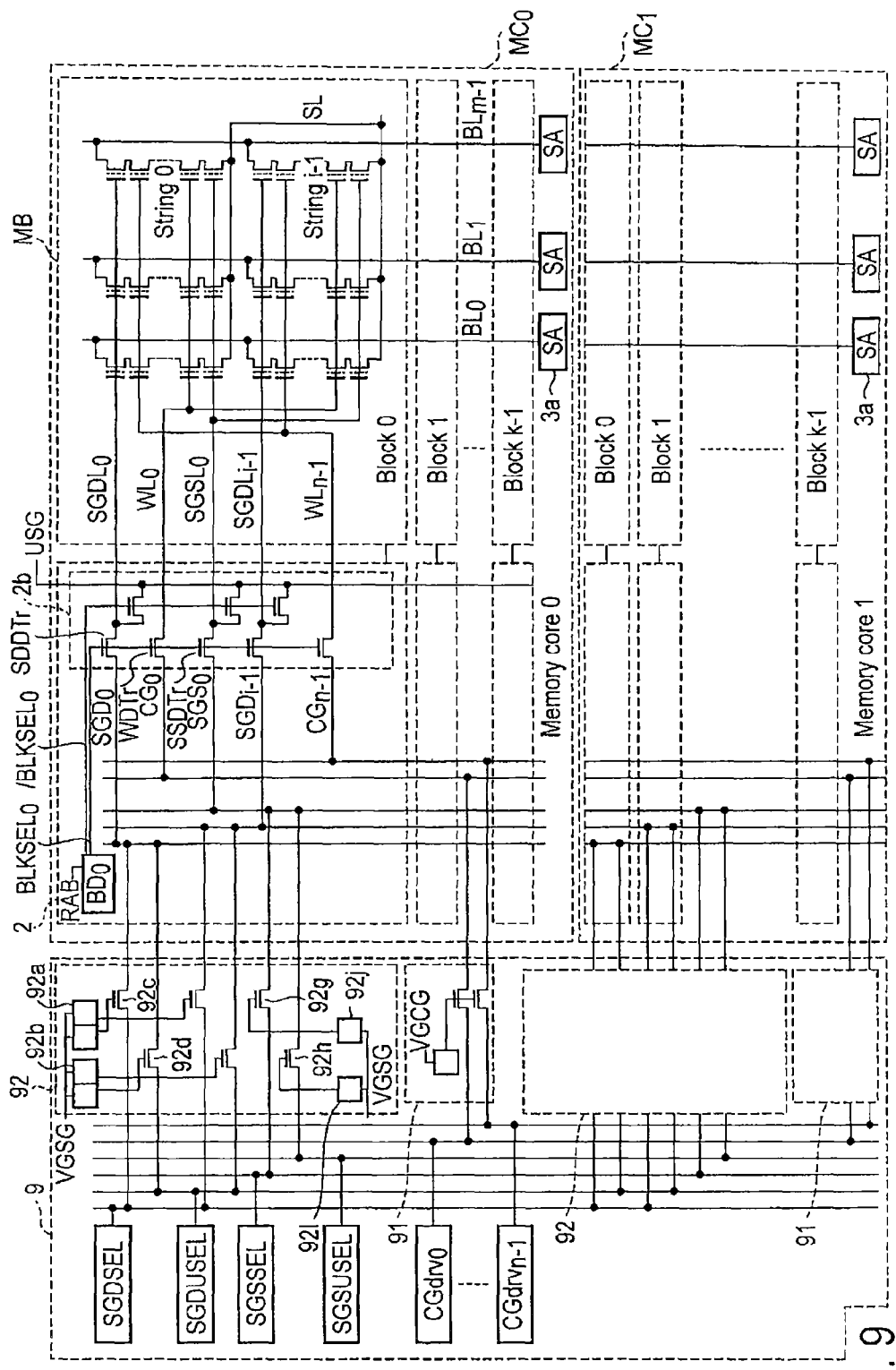
F I G. 9

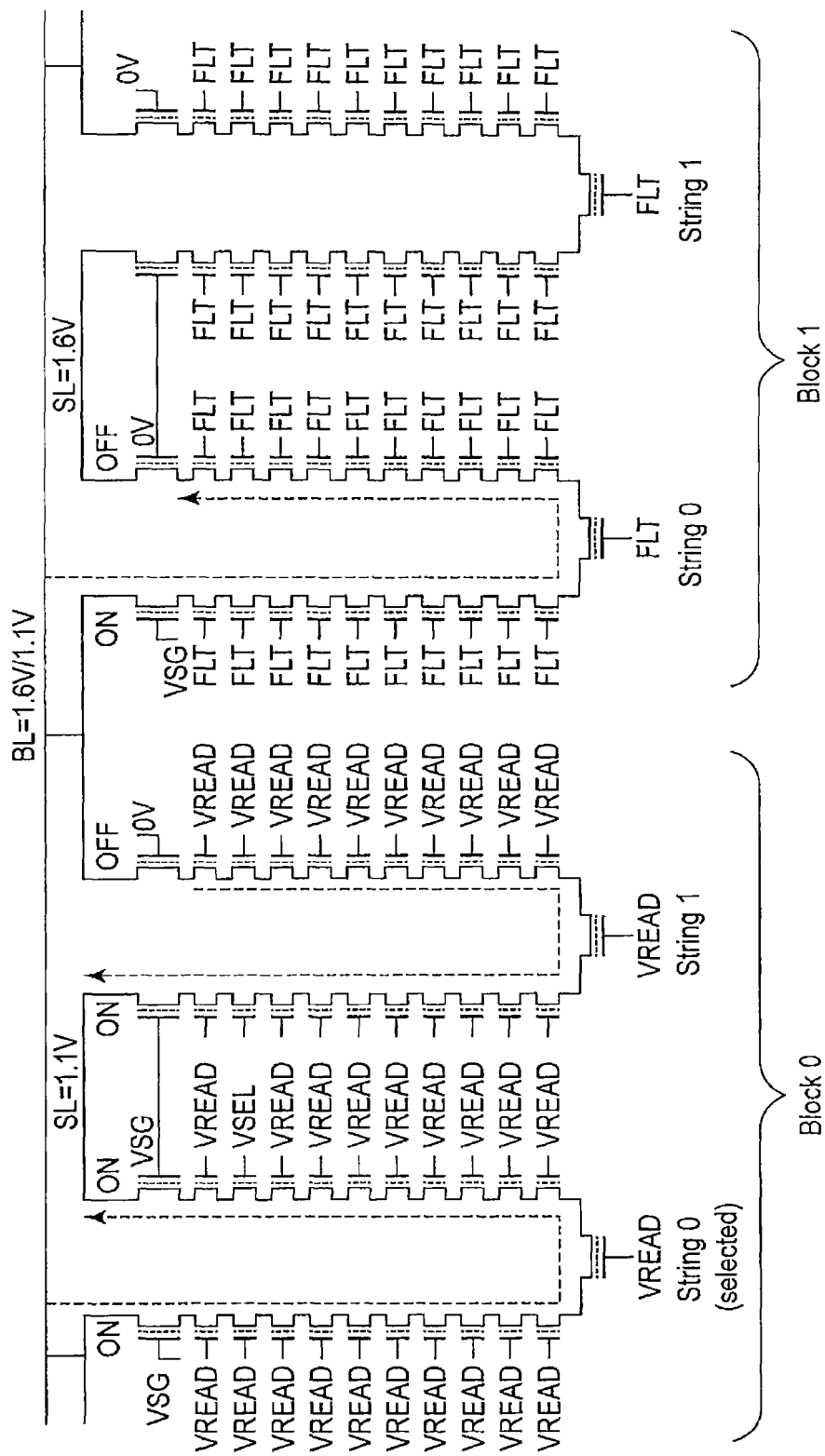
F I G. 12

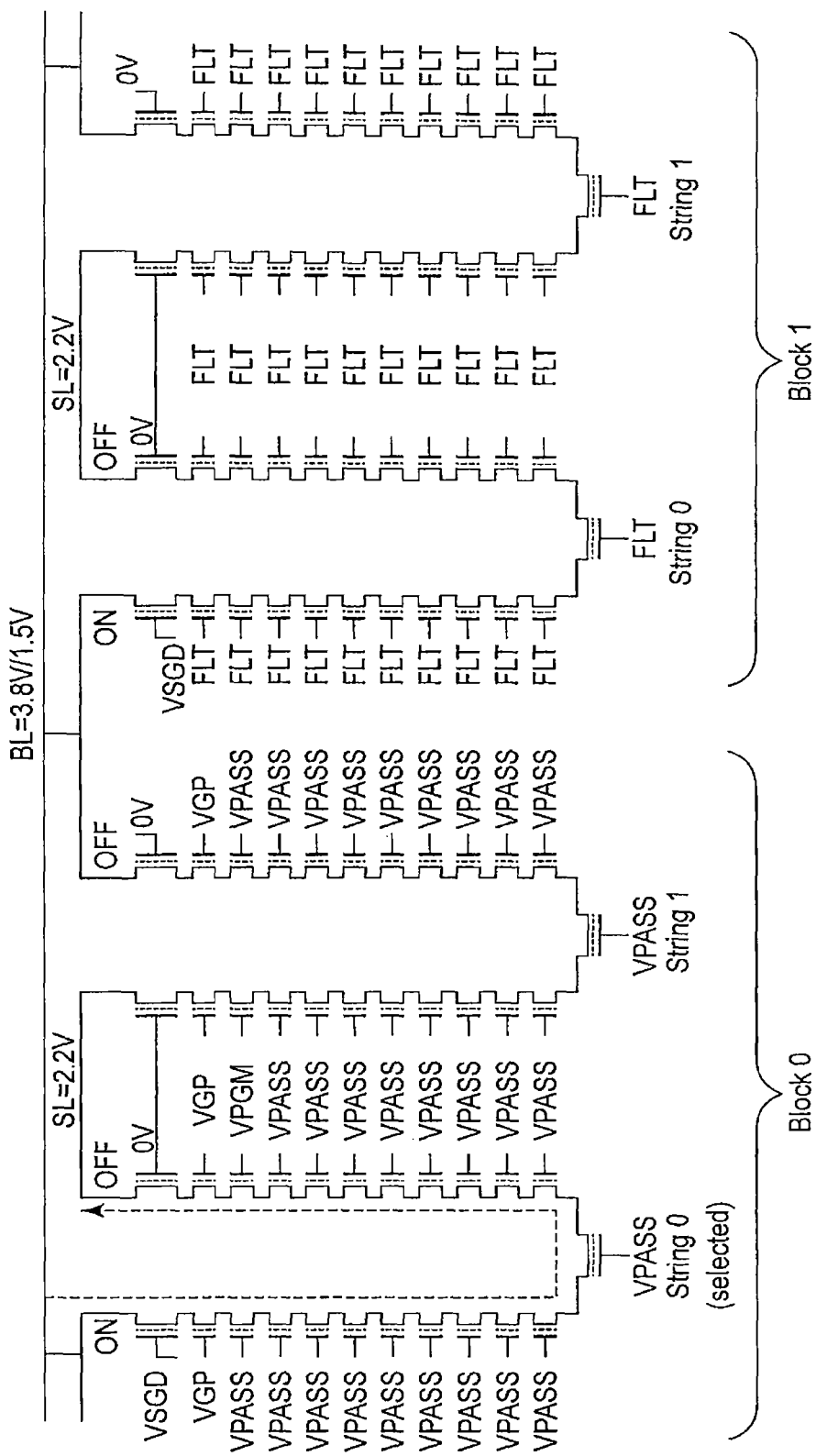
F I G. 13

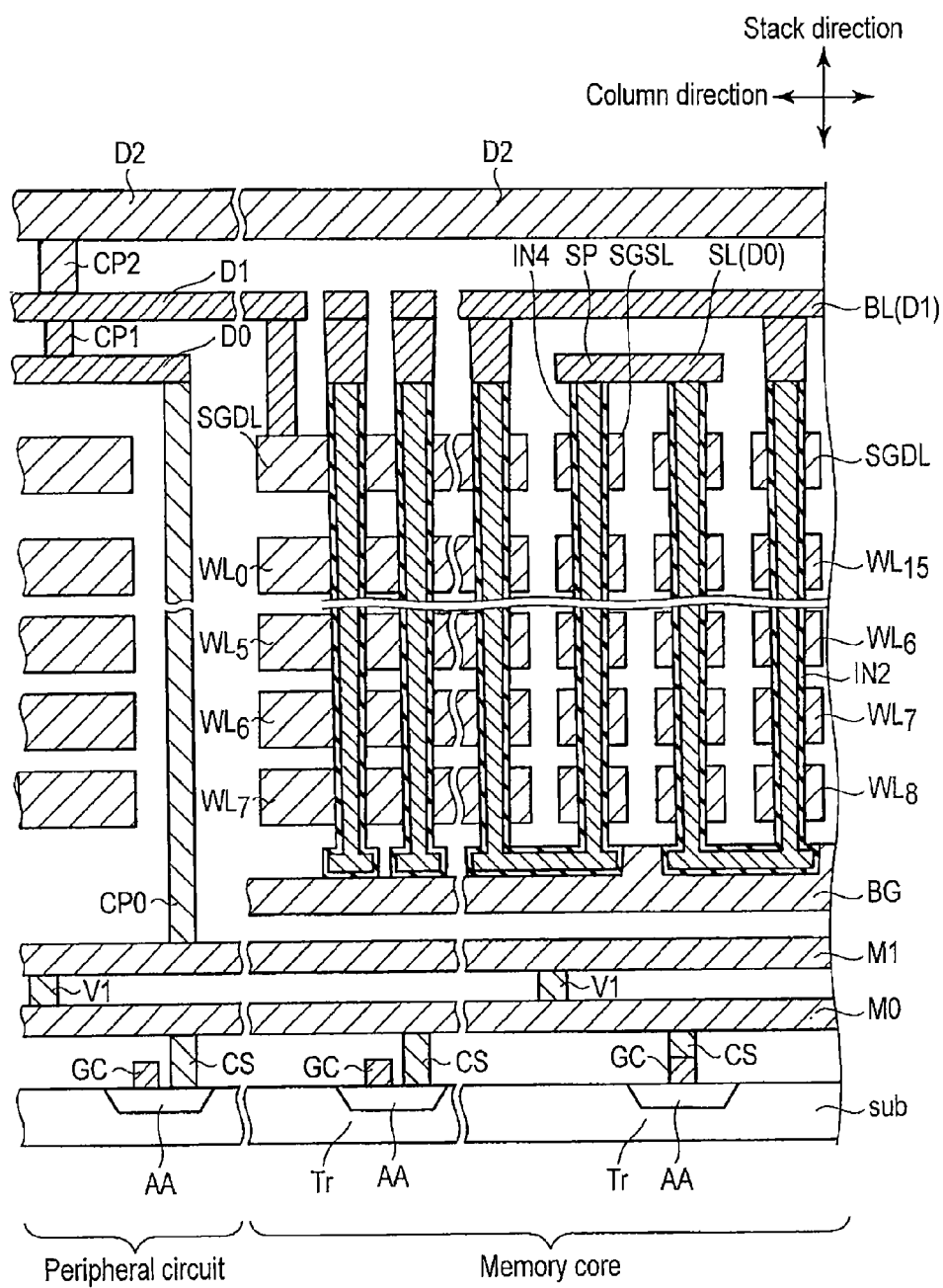
F I G. 17

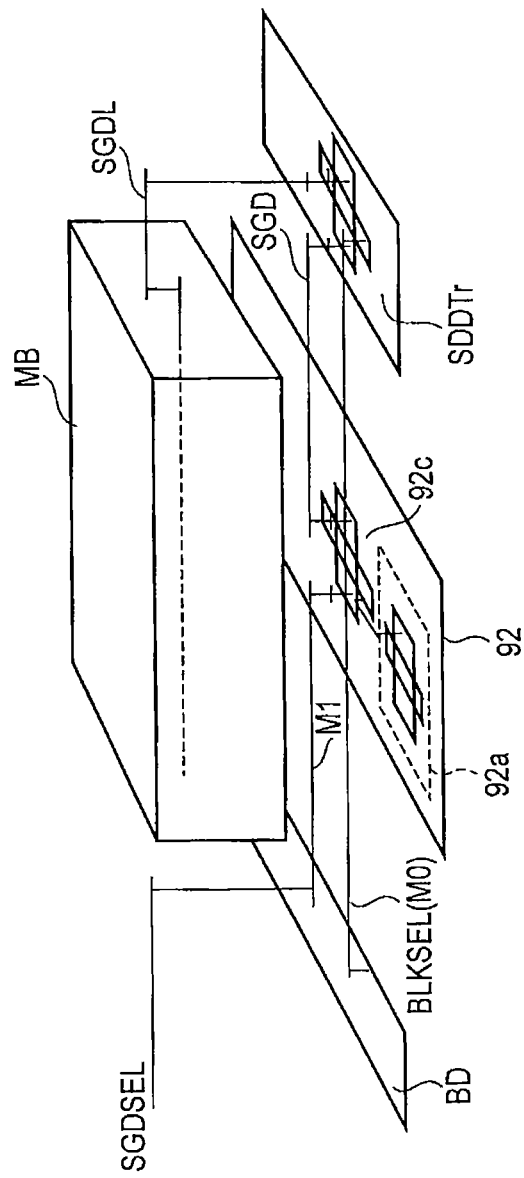
F I G. 18

SEMICONDUCTOR MEMORY DEVICE

CROSS-REFERENCE TO RELATED APPLICATIONS

This application is based upon and claims the benefit of priority from Japanese Patent Application No. 2012-065653, filed Mar. 22, 2012, the entire contents of which are incorporated herein by reference.

FIELD

Embodiments described herein relate generally to a semiconductor memory device.

BACKGROUND

Three-dimensional structure NAND flash memories manufactured with BiCS technique manufacturing processes are known. Such memories use a structure to allow multiple memory strings to share word lines to reduce the number of transistors for selecting a specific word line, and therefore reduce the area thereof. In contrast, interconnects for select gates are provided for each memory string. The purpose is to allow for selecting one memory string among the memory strings since memory strings which share word lines are also coupled to the same bit line. In this way, various disturbs resulting from the word-line sharing are prevented to realize desired operations.

BRIEF DESCRIPTION OF THE DRAWINGS

FIG. 1 illustrates a block diagram of a semiconductor memory device according to a first embodiment.

FIG. 6 illustrates a circuit diagram of a semiconductor memory device for reference.

FIG. 8 illustrates a circuit diagram of the semiconductor memory device according to the first embodiment.

FIG. 9 illustrates a circuit diagram of a semiconductor memory device according to a second embodiment.

FIG. 12 illustrates voltages at principle nodes during reading according to the third embodiment.

FIG. 13 illustrates voltages at principle nodes during writing according to the third embodiment.

FIG. 17 illustrates a sectional view of the semiconductor memory device according to the fifth embodiment.

FIGS. 18 to 21 illustrate perspective views conceptually showing example semiconductor memory devices according to the fifth embodiment.

DETAILED DESCRIPTION

Figure 2:
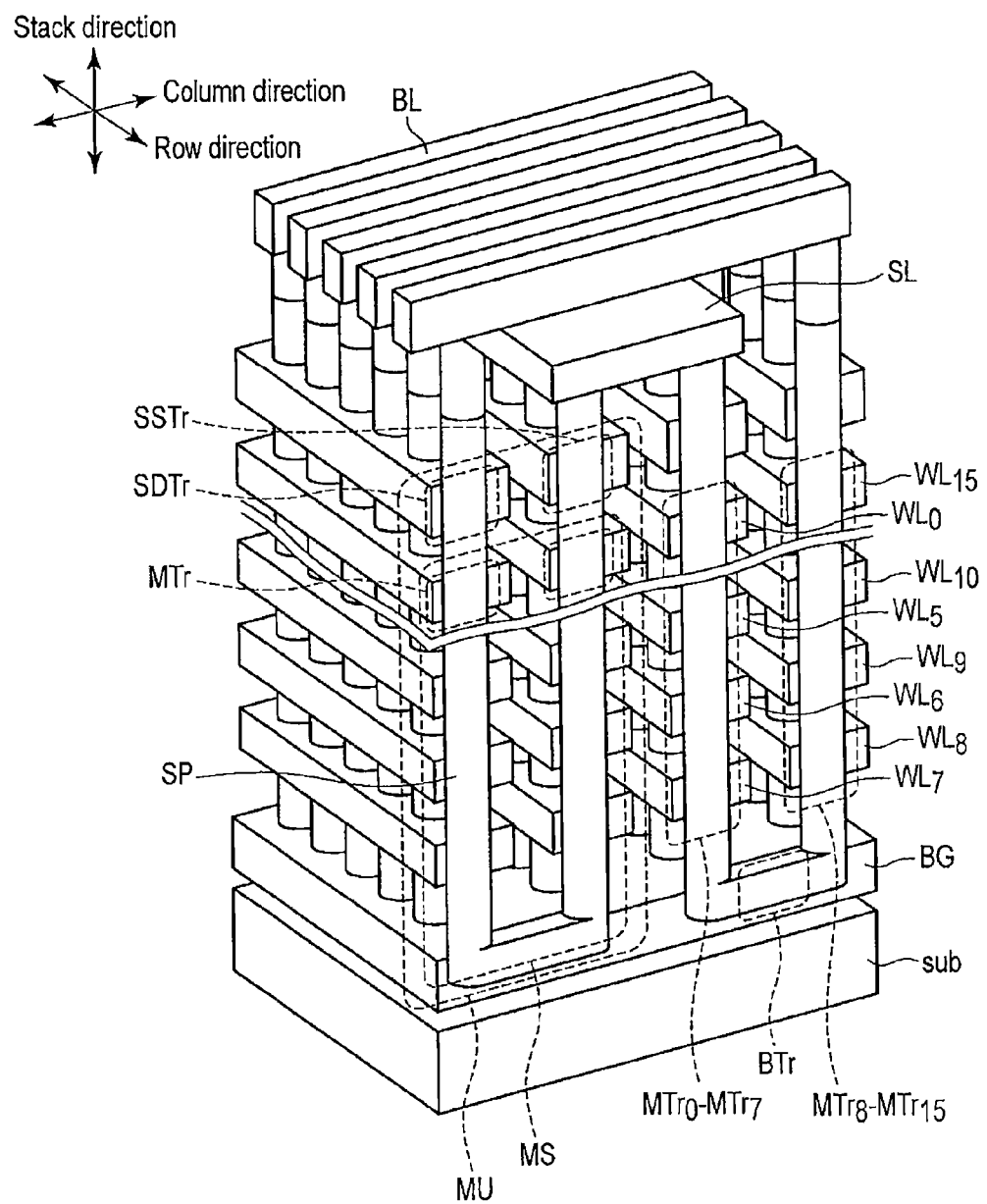
FIG. 2 illustrates a perspective view of a part of a memory cell array according to the first embodiment.

In general, according to one embodiment, a semiconductor memory device includes memory units each comprising a first transistor, memory cell transistors, and a second transistor which are serially coupled between a first end and a second end. Memory cell transistors each of which is one of the memory cell transistors of each of the memory units have their gate electrodes coupled to each other. A bit line is coupled to respective first ends of the memory units. A first driver is configured to output voltage applied to a selected one of the first transistors. A second driver is configured to output voltage applied to unselected ones of the first transistors. A third driver is configured to output voltage applied to a selected one of the second transistors. A fourth driver is configured to output voltage applied to unselected ones of the second transistors. A selector is configured to selectively individually couple the gate electrode of the first transistor of each of the memory units to the first or second driver, and selectively individually couple the gate electrode of the second transistor of each of the memory units to the third or fourth driver.

Embodiments will now be described with reference to drawings. Components with substantially the same functionalities and configurations will be referred to with the same reference number and duplicate descriptions will be made only when required. Note that figures are schematic and the relationship between the thickness and the plane dimension of a film and the ratios of the thickness of one layer to another may differ from actual values. Therefore, it should be noted that a specific thickness and dimension should be determined in accordance with the following description. Moreover, it is natural that different figures may contain a component different in dimension and/or ratio.

The embodiments described in the following only illustrate devices and methods which embody the technical idea of the embodiments, and the technical idea of the embodiments do not limit the material, dimension, structure, and arrangement of components to the following ones. The technical idea of the embodiments may be variously changed within the scope of the claims.

The term "to couple" as used in either the detailed description or the claims is interchangeable with "to connect", and its meaning includes "to physically couple" and "to electrically couple".

First Embodiment

FIG. 1 illustrates a block diagram of a semiconductor memory device 10 according to the first embodiment. It is not essential to distinguish functional blocks as the following example. For example, some of the functionalities may be performed by a functional block different from that illustrated below. An illustrated functional block may also be divided into functional sub-blocks. The embodiment is not limited by the specification of the particular functional blocks.

As shown in FIG. 1, the semiconductor memory device 10 may include memory cell arrays 1, row decoders 2, data circuit and page buffers 3, column decoders 4, a controller 5, an input/output circuit 6, an address command register 7, a voltage generator 8, and a core driver 9.

The semiconductor memory device 10 may include two memory cell arrays 1 or more. FIG. 1 illustrates two memory cell arrays 1; however the device 10 may include one memory cell array 1, or three memory cell arrays 1 or more. A memory cell array may also be referred to as a plane. When two planes are distinguished, they may be referred to as plane 0 and plane 1. Each memory cell array 1 includes memory blocks, which may be referred to as blocks hereinafter. Each block may include memory cells, word lines WL, and bit lines BL, and the like. Specific memory cells or their memory space configure a page. Data is read and written per page. Details of the memory cell array 1 will be described later.

A set of the row decoder 2, data circuit and page buffer 3, and column decoder 4 is provided for each memory cell array. The row decoder 2 receive a block address signal from the address command register 7, and also receive word line control signals and select gate control signals from the core driver 9.

Each row decoder 2 selects a specific block or a specific word line based on the received block address signals, word line control signals, and select gate control signals. The data circuit and page buffers 3 read data from the respective memory cell arrays 1, and temporarily store the read data during reading. The data circuit and page buffers 3 also receive to-be-written data from outside the semiconductor memory device 10, and write the received data to selected memory cells during writing. Each data circuit and page buffer 3 includes a sense amplifier 3a. The sense amplifier 3a includes sense amplifiers coupled to respective bit lines BL, and amplifies data read from memory cell array 1 to corresponding bit lines BL. The semiconductor memory device 10 is configured to store data of two bits or more in a memory cell. For example, the semiconductor memory device 10 can store two-bit data per memory cell. To this end, each data circuit and page buffer 3 includes three data caches 3b. The first data cache 3b stores one of lower page data and upper page data, and the second data cache 3b stores the other. A lower page data consists of a set of lower bits of two-bit data of associated memory cells. An upper page data consists of a set of upper bits of two-bit data of associated memory cells. The third data cache 3b stores temporary data to be re-written in specific memory cells in accordance with the result of verify reading, which is a part of writing, for example.

The column decoders 4 receive a column address signal from the address command register 7, and decode the received column address signal. In accordance with the decoded address signal, the column decoders 4 controls input and output of data of to and from the respective data circuit and page buffers 3.

The controller 5 receives commands which instruct reading, writing, or erasure, and the like, from the address command register 7. The controller 5 controls the voltage generator 8 and core driver 9 in accordance with a predetermined sequence based on the instructions by the commands. Following the instructions from the controller 5, the voltage generator 8 generates various voltages required for core operations. Following the instructions from the controller 5, the core driver 9 controls the row decoders 2 and data circuit and page buffers 3 in order to control the word lines WL and bit lines BL. The input/output circuit 6 controls input and output of data, commands, and addresses from and to outside the semiconductor memory device 10.

Figure 3:
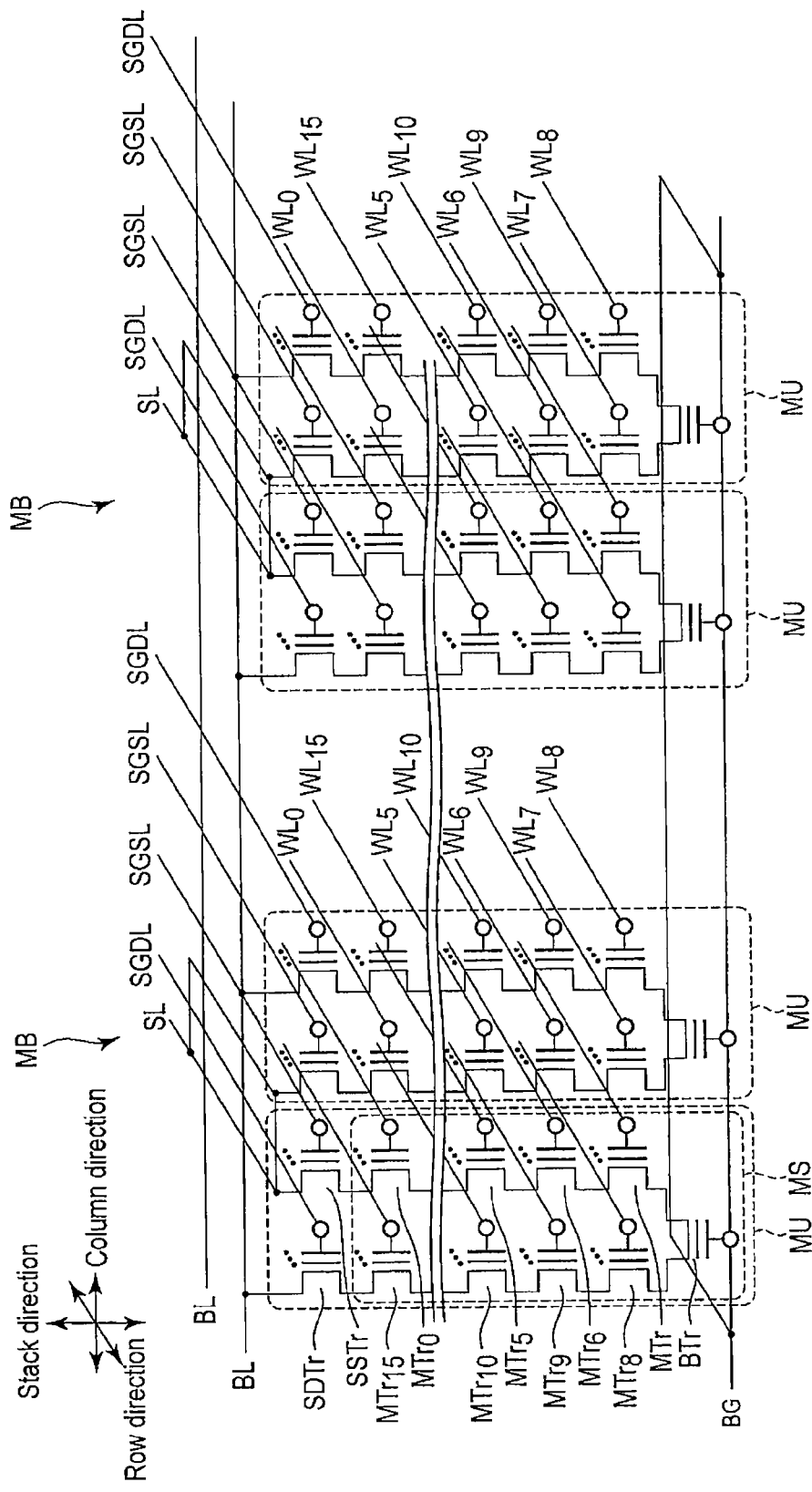
FIG. 3 illustrates a circuit diagram of the memory cell array according to the first embodiment.

A memory cell array 1 has a structure shown in FIGS. 2 and 3. FIG. 2 illustrates a perspective view of a part of the memory cell array according to the first embodiment. FIG. 3 illustrates a circuit diagram of the memory cell array 1 according to the first embodiment. As shown in FIGS. 2 and 3, the memory cell array 1 may include the bit lines BL, common source lines SL, and memory blocks MB. The source lines SL extend along the row direction. The bit lines BL extend along the column direction, which perpendicularly intersects. The blocks MB are located in a line along the column direction at intervals. A block MB has memory units MU arranged in the matrix along the row and column directions. In a block MB, a bit line BL is coupled to multiple memory units MU.

A memory unit MU has a memory string MS, a source-side select gate transistor SSTr, and a drain-side select gate transistor SDTr. A memory string MS is located above a substrate sub in the stack direction. A memory string MS includes serially-coupled n (n being 16, for example) memory cell transistors $MTr_0$ to $MTr_{15}$ and a back gate transistor BTr. When reference numerals with a subscript (for example, cell transistor MTr) do not need to be distinguished from each other, a reference numeral without the subscript is used, and it refers to all reference numerals with the subscripts collectively, or one of them as a representative. Cell transistors $MTr_0$ to $MTr_7$ are located in a line along the stack direction towards the substrate sub in the mentioned order. Cell transistors $MTr_8$ to $MTr_{15}$ are located in a line along the stack direction away from the substrate sub in the mentioned order. A cell transistor MTr includes a semiconductor pillar SP, insulator on the surface of the semiconductor pillar SP, and a word line (or control gate) WL as will be described in full detail later.

The back gate transistor BTr is coupled between the bottom cell transistors $MTr_7$ and $MTr_8$. Therefore, cell transistors $MTr_0$ to $MTr_{15}$ and back gate transistor BTr configure a U-shape along the plane which consists of the column and stack directions. As a result of the cell transistors MTr thus provided, the cell transistors MTr are arranged in the matrix along both the plane which consist of the column and stack directions and the plane which consists of the column and row directions.

The select gate transistors SSTr and SDTr are located above the cell transistor $MTr_0$ and $MTr_{15}$ along the stack direction, respectively. The drain of each transistor SSTr is coupled to one end of a corresponding memory string MS (or the source of the memory cell $MTr_0$). The source of each transistor SDTr is coupled to the other end of the memory string MS (or the drain of the memory cell $MTr_{15}$). One end of each transistor SDTr is coupled to a bit line BL. One end of each transistor SSTr is coupled to the common source line SL.

The gates of the respective cell transistors $MTr_0$ of the respective memory units MU located in a line along the row direction in each block MB are commonly coupled to a word line $WL_0$. Similarly, the gates of the respective cell transistor $MTr_1$ to $MTr_{15}$ of respective memory units MU located in a line along the row direction in each block MB are commonly coupled to respective word lines $WL_1$ to $WL_{15}$. The word lines WL extend along the row direction. The gates of the respective back gate transistors BTr are commonly coupled to a back gate line BG.

The gates of the respective drain-side select gate transistors SDTr of the respective memory units MU located in a line along the row direction in each block MB are commonly coupled to a drain-side select gate line SGDL. The drains of the respective select gate transistors SDTr of the respective memory units MU located in a line along the column direction are commonly coupled to a bit line BL. The select gate lines SGDL extend along the row direction.

The gates of the respective source-side select gate transistors SSTr of the respective memory units MU located in a line along the row direction in each block MB are commonly coupled to a source-side select gate line SGSL. The sources of respective source-side select gate transistors in two memory units MU adjacent in a line along the column direction are coupled to the same source line SL. The sources of respective select gate transistors SSTr of the respective memory units MU located in a line along the row direction in each block MB are coupled to the same source line SL. The select gate lines SGSL and source line SL extend along the row direction.

Figure 4:
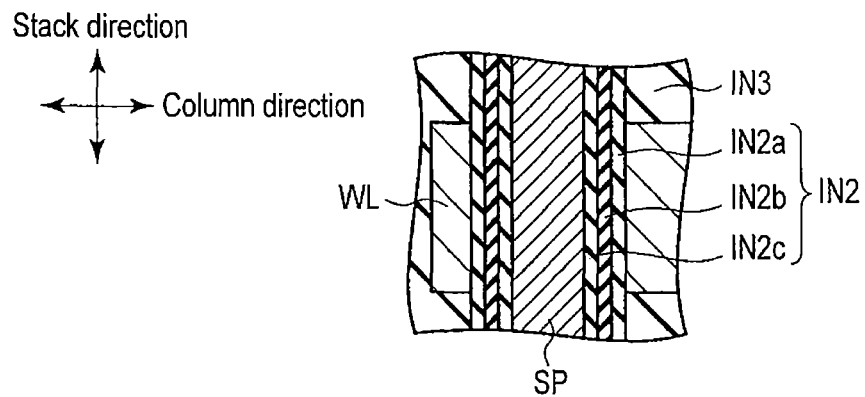
FIG. 4 illustrates a sectional view of a memory cell transistor according to the first embodiment.

The cell transistor MTr has the structure shown in FIG. 4. FIG. 4 illustrates a sectional view of the cell transistor according to the first embodiment. The word lines (or gates) WL may include or consist of polysilicon or polycide. A hole is formed through the word lines WL and insulator IN3 between them. On the surface of the hole, a memory gate insulator IN2 is formed and semiconductor pillar SP is formed in the hole. Such semiconductor pillars extend along the stack direction, are arranged in the matrix which consists of the row and column directions, and may include or consist of semiconductor such as silicon with impurities introduced. Source/drain areas are formed in the semiconductor pillar SP, and the source/drain areas of adjacent cell transistors MTr are coupled to each other.

The insulator IN2 includes block insulator IN2a, a charge storage layer IN2b, and tunnel insulator IN2c. The block insulator IN2a may include or consist of silicon oxide ($SiO_2$). The charge storage layer IN2b is formed on the block insulator IN2a. The charge storage layer IN2b accumulates electrical charge, and is used to store the data of the cell transistor MTr. The charge storage layer IN2b may include or consist of silicon nitride (SiN). The tunnel insulator IN2c is formed on the charge storage layer IN2b. The tunnel insulator IN2c may include or consist of silicon oxide. In accordance with the number of carriers in the charge storage layer IN2b and the potential of the word line WL, the cell current which flows through the semiconductor pillar SP varies, and this variations is used to non-volatilely store data in the cell transistor MTr.

Figure 5:
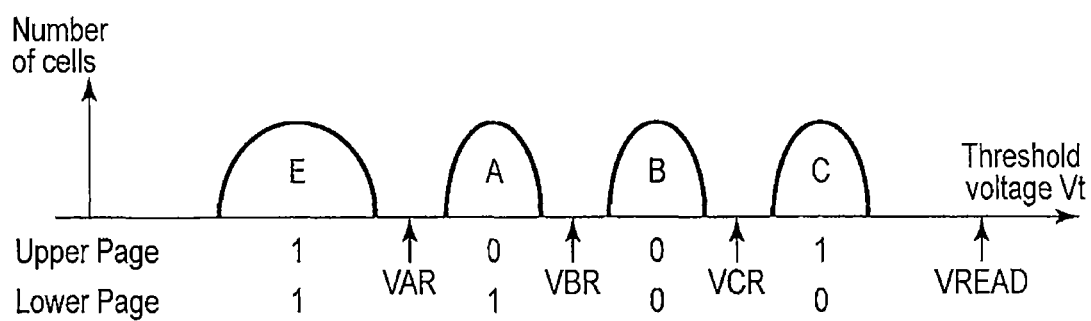
FIG. 5 illustrates a relationship between states of the memory cells and corresponding data according to the first embodiment.

FIG. 5 illustrates storing of data in the semiconductor memory device 10 according to the first embodiment. Specifically, FIG. 5 illustrates an example relationship between different states of cell transistors and corresponding data. In particular, FIG. 5 illustrates an example where a cell transistor stores two-bit data. In order to store two-bit data per cell, the cells transistor MTr can have four variable threshold voltages. The cell transistors MTr are controlled to have a desired threshold voltage Vt through control of the number of the carriers in their charge storage layers IN2b. In fact, due to variation in property among the cell transistors MTr, cell transistors MTr assigned the same threshold voltage Vt have different threshold voltages Vt distributed as shown in FIG. 5. The lowest voltage distribution E can be obtained by the erasure to the cell transistors MTr. Distributions A to C are obtained by writing to the cell transistors MTr.

In order to store two-bit data per cell, the two bits are associated with two page addresses, respectively. Specifically, data of the lower page and that of the upper page are stored by a memory cell. FIG. 5 illustrates a relationship between distributions E, A, B, and C, and the lower and upper page data corresponding to the distributions. More specifically, data "1" of the lower page may be associated with distributions E and A, and data "0" of the lower page may be associated with distributions B and C. Data "1" of the upper page may be associated with distributions E and C, and data "0" of the upper page may be associated with distributions A and B.

Such association enables to determine whether a lower-page bit holds data of "1" or "0" through reading with a voltage VBR applied to the corresponding word line WL. Specifically, a cell transistor MTr with a threshold voltage included in distribution E or A turns on when it receives the voltage VBR at its word line WL. As a result, cell current flows from the corresponding bit line BL to the source line SL through the cell transistor MTr. In contrast, a cell transistor MTr with a threshold voltage included in distribution B or C does not turn on when it receives the voltage VBR at its word line WL, and therefore no cell current flows through it. Such a cell-current difference is detected by the corresponding sense amplifier 3a to determine whether the read-target cell transistor MTr stores "0" or "1" data in its lower bit.

For the upper-page bit, the data circuit and page buffer 3 executes a predetermined operation to cell current read through applying voltages VAR and VCR to the corresponding word line WL to determine the data. Specifically, a cell transistor MTr determined to have the threshold voltage between the voltages VAR and VCR is determined to store "0" data in its upper bit, and that determined to have a threshold voltage lower than the voltage VAR or higher than the voltage VCR is determined to store "1" data in its upper bit. The voltage VREAD turns on the cell transistors MTr regardless of stored data.

Description will now be made of a circuit for implementing the semiconductor memory device 10 of the configuration of FIGS. 1 to 5. First, a possible circuit for implementing the semiconductor memory device 10 will be described with reference to FIG. 6 for reference. FIG. 6 illustrates the most simply configured circuit.

As shown in FIG. 6, each memory cell array includes k blocks $MB_0$ to $MB_{k-1}$. Bit lines $BL_0$ to $BL_{m-1}$ traverse all the blocks MB in a plane, where m may be 64K. The bit lines BL are coupled to respective sense amplifiers 3a. For simplification purpose, FIG. 6 only illustrates some of word lines $WL_0$ to $WL_{n-1}$. As for back gate lines BG, back gate control lines exist similarly to the word lines WL; however they are not depicted in FIG. 6.

Memory strings MS located in a line along the row direction, i.e., memory strings MS respectively coupled to the bit lines $BL_0$ to $BL_{m-1}$ share word lines $WL_0$ to $WL_{n-1}$, as described above. Specifically, cell transistors $MTr_0$ located in a line along the row direction, which correspond to the horizontal direction in FIG. 6, are coupled to the word line $WL_0$. The same holds true for the word lines $WL_1$ to $WL_{n-1}$. The shared size of the word line WL is equivalent to the physical length of this word line WL. The page size may be equal to the length of the corresponding word line WL or its integral multiple. For example, cell transistors MTr which share a word line WL or their memory space corresponds to one page. As described above, the semiconductor memory device 10 accesses the memory cells per page. Moreover, as described above, select gate transistors SDTr located in a line along the row direction also share a select gate line SGDL, and select gate transistors SSTr located in a line along the row direction also share a select gate line SSDL. Memory units MU (i.e., a set of memory string MS and select gate transistors SSTr and SDTr) located in a line along the row direction and sharing word lines WL and select gate lines SGDL and SGSL configure a unit, which is referred to as a string. Each block MB includes i strings, where i may be 12, for example.

In each block MB, the strings 0 to i–1 also share word lines WL. Specifically, in each block MB, each word line $WL_0$ of the strings 0 to i–1 are coupled to each other. The same holds true for the word lines $WL_1$ to $WL_{n-1}$. Therefore, multiple memory units MU are coupled to a bit line BL, and such memory units MU also share word lines WL. This means that selection of a certain word line WL selects multiple cell transistors MTr in memory units MU which are coupled to this word line WL and coupled to the same bit line BL. However, in order to enable access of the cell transistors MTr, selecting a word line WL and a bit line BL needs to select only one cell transistor MTr. Specifically, for all bit lines BL, only one memory string MS must be able to be coupled to a bit line BL. To this end, it is necessary that at least one of the select gate transistors SDTr and SSTr can be controlled independently among strings. Then, for strings 0 to i−1, drain-side select gate lines $SGDL_0$ to $SGDL_{i-1}$ are provided, respectively, and source-side select gate lines $SGSL_0$ to $SGSL_{i-1}$ are provided, respectively. In this way, only a memory string MS can be coupled to a bit line BL through its select gate transistor SDTr and to the source line SL through its select gate transistor SSTr.

Each row decoder 2 includes block decoders BD and drive transistor units 2b. For each block MB, a block decoder BD and a drive transistor unit 2b are provided. Each drive transistor unit 2b includes n WL drive transistors $WDTr_0$ to $WDTr_{n-1}$, i SGDL drive transistors $SDDTr_0$ to $SDDTr_{i-1}$, and i SGSL drive transistors $SSDTr_0$ to $SSDTr_{i-1}$. The word lines $WL_0$ to $WL_{n-1}$ are coupled to CG lines $CG_0$ to $CG_{n-1}$ via WL drive transistors $WDTr_0$ to $WDTr_{n-1}$, respectively. Select gate lines $SGDL_0$ and $SGSL_0$ for string 0 are coupled to an SGD line $SGD_0$ and a SGS line $SGS_0$ via transistors $SDDTr_0$ and $SSDTr_0$, respectively. Similarly, select gate lines $SGDL_X$ and $SGSL_X$ for string X (X being an integer between 0 to i−1) are coupled to an SGD line $SGD_X$ and a SGS line $SGS_X$ via transistors $SDDTr_X$ and $SSDTr_X$, respectively. The respective gates of all transistors WDTr, SDDTr, and SSDTr in the block $MB_0$ receive a block select signal $BLKSEL_0$ from the block decoder $BD_0$. Similarly, the respective gates of all the transistors WDTr, SDDTr, and SSDTr in block $MB_Y$ (Y being an integer between 0 to k−1) receive a block select signal $BLKSEL_Y$ from block decoder $BD_Y$. To the select gate lines SGDL and SGSL and word lines WL in a selected block MB, voltages from a driver (to be described later) are transferred via the transistors SDDTr and SSDTr, and WDTr, respectively.

The select gate lines SGDL and SGSL and word lines WL receive a signal USG via respective transistors UTr. The respective gates of all transistors UTr in the block $MB_0$ receive a block select signal $/BLKSEL_0$ from the block decoder $BD_0$, where the sign "/" indicates negative logic. Similarly, respective gates of all transistors UTr in the block $MB_Y$ receive a block select signal $/BLKSEL_Y$ from the block decoder $BD_Y$.

The block decoders BD receive a block address signal RAB from the address command register 7. The block decoders BD decode signal RAB. A block decoder BD selected in accordance with the decoding asserts the corresponding signal BLKSEL to select a specific block MB. Transistors UTr in a selected block MB turns off. In contrast, in an unselected block MB, transistors UTr turn on and the signal USG (for example, 0 V) is applied to the select gate lines SGDL and SGSL and word lines WL.

In the following description, a set of a memory cell array 1, a part of the corresponding row decoder 2, and the corresponding data circuit and page buffer 3 (in particular the sense amplifier 3a) is referred to as a memory core MC. In the ongoing context, the semiconductor memory device 10 has two memory cores $MC_0$ and $MC_1$. The core driver 9 serves both two memory cores MC.

The core driver 9 includes i SGD drivers $SGDdrv_0$ to $SGDdrv_{i-1}$ and i SGS drivers $SGSdrv_0$ to $SGSdrv_{i-1}$. The SGD drivers $SGDdrv_0$ to $SGDdrv_{i-1}$ are used to drive the select gate lines SGDL. SGS drivers $SGSdrv_0$ to $SGSdrv_{i-1}$ are used to drive the select gate lines SGSL. The SGD drivers $SGDdrv_0$ to $SGDdrv_{i-1}$ are coupled to SGD lines $SGD_0$ to $SGD_{i-1}$ of each memory core MC, respectively. The SGS drivers $SGSdrv_0$ to $SGSdrv_{i-1}$ are coupled to SGS lines $SGS_0$ to $SGS_{i-1}$ of each memory core MC, respectively. As described above, multiple memory units MU share a bit line BL, and such memory units MU also share word lines WL. For this reason, upon access to the cell transistors MTr, in order for only a memory string MS to be coupled to a bit line BL, the memory units MU need to be able to individually couple or uncouple its memory string MS to the bit line BL. To this end, pairs of the SGD driver SGDdrv and SGS driver SGSdrv of the same number as the number i of strings in a block MB are provided. During reading or writing, the SGD driver SGDdrv and SGS driver SGSdrv for a selected string output operation-specific voltages which will be applied to the select gate lines SGDL and SGSL. The SGD driver SGDdrv and SGS driver SGSdrv for an unselected string outputs 0 V or a relatively low voltage. During erasure, all the SGD drivers SGDdrv and SGS drivers SGSdrv output operation-specific voltages which will be applied to the select gate lines SGDL and SGSL. Alternatively, only the SGD drivers SGDdrv for all the strings or only the SGS drivers SGSdrv for all the strings may output the voltages.

The core driver 9 further includes CG drivers $CGdrv_0$ to $CGdrv_{n-1}$, and selectors 91. A selector 91 is provided for a memory core MC. CG drivers $CGdrv_0$ to $CGdrv_{n-1}$ output various voltages which will be applied to the word lines WL based on the voltages from the voltage generator 8. Each selector 91 includes transfer transistors 91b of the same number as the number n of the cell transistors MTr in a memory string MS. The n transistors 91b selectively couple the CG drivers $CGdrv_0$ to $CGdrv_{n-1}$ to the CG lines $CG_0$ to $CG_{n-1}$, respectively. The respective gates of the transistors 91b receive respective control signals from the converter 91a. The converter 91a receives a voltage VGCG and predetermined control signals from the controller 5. The predetermined control signals may include an address-related signal for selecting the memory core $MC_0$ or $MC_1$, a timing signal for controlling output timing of the converter 91a, and the like. The converter 91a applies, to the gate of a transistor 91b determined in accordance with the received signals, the voltage for turning on this transistor. The converter 91a includes a logic circuit and a level shifter, and the like, for such functionality. For a case where only one memory core MC should operate during a certain period, only CG lines CG of the selected memory core MC need to be coupled to the CG driver CGdrv. In such a case, the CG drivers CGdrv can be coupled to only the selected memory core MC by the converter 91a.

Figure 7:
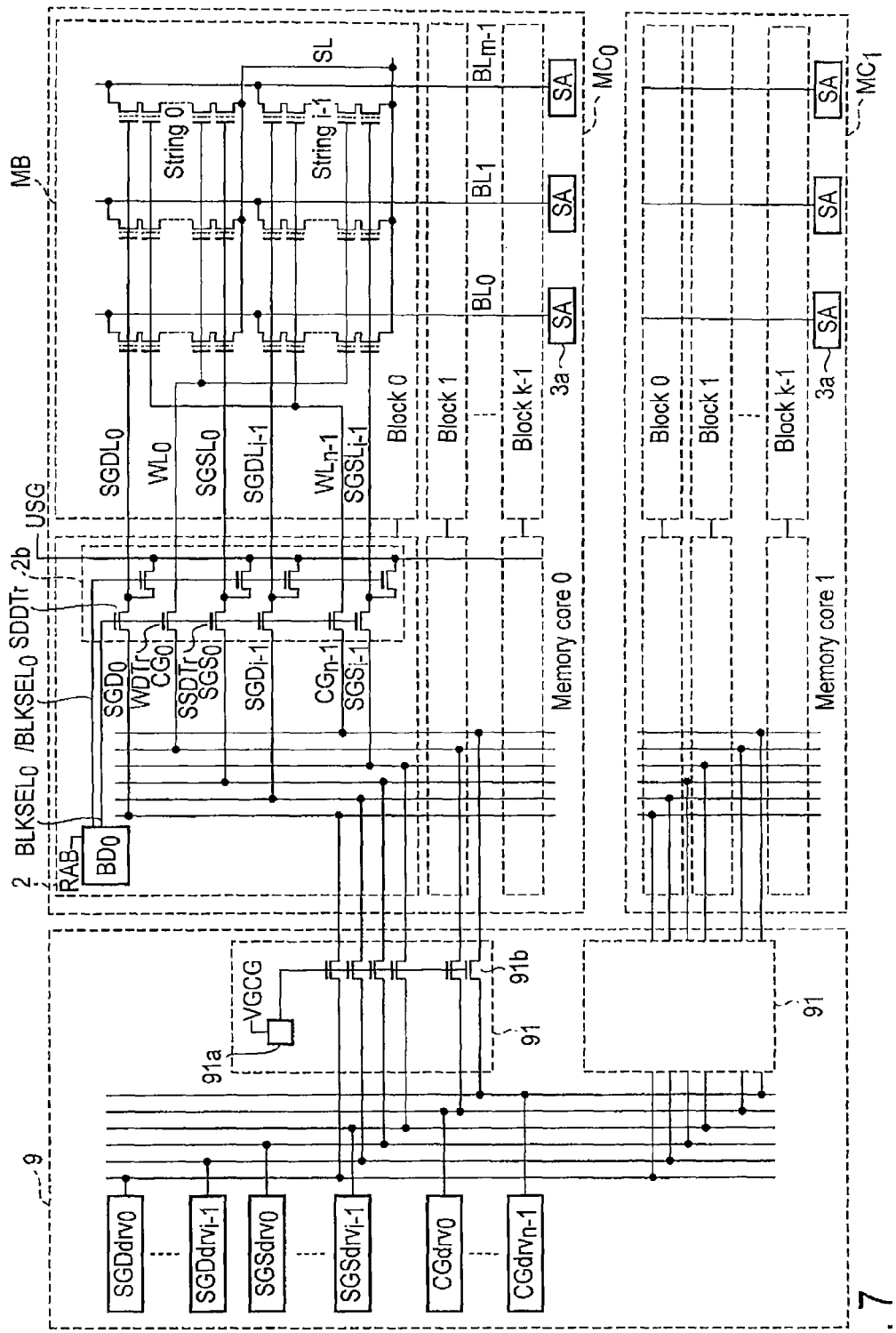
FIG. 7 illustrates another circuit diagram of a semiconductor memory device.

FIG. 7 illustrates another example circuit for implementing the semiconductor memory device 10. FIG. 7 shows an example where connection between the SGD driver SGDdrv and SGS driver SGSdrv and the SGD line SGD and SGS line SGS is also controlled by the selector 91. The selector 91 further includes i×2 transfer transistors 91b. The SGD drivers $SGDdrv_0$ to $SGDdrv_{i-1}$ are coupled to the SGD lines $SGD_0$ to $SGD_{i-1}$ via i transfer transistors 91b, respectively. The SGS drivers $SGSdrv_0$ to $SGSdrv_{i-1}$ are coupled to the SGS lines $SGS_0$ to $SGS_{i-1}$ via i transfer transistors 91b, respectively. When only one memory core MC should operate during a certain period as with the case for the CG lines CG, only the selected SGD line SGD and SGS line SGS of a selected memory core MC can be coupled to the SGD driver SGDdrv and SGS driver SGSdrv, which can reduce the current consumption.

The examples of FIGS. 6 and 7 includes a structure to drive the CG lines CG and SGD lines SGD, and SGS lines SGS while avoiding unnecessary current consumption; however they still include i SGD drivers and i SGS drivers, which results in total of i×2 output interconnects from these drivers. The more the number of strings of the semiconductor memory device 10 with an increased capacity, the larger the area for the SGD drivers, SGS drivers, and associated interconnects. Then, the semiconductor memory device 10 according to the first embodiment has a configuration illustrated in FIG. 8. FIG. 8 illustrates a circuit diagram of the semiconductor memory device 10 according to the first embodiment, and illustrates a configuration for implementing the semiconductor memory device 10 of FIGS. 1 to 5.

As shown in FIG. 8, the semiconductor memory device 10 has the same configuration for the memory cores MC as that in FIGS. 6 and 7. Specifically, the semiconductor memory device 10 may have two memory cores $MC_0$ and $MC_1$. Each memory core MC includes the memory cell array 1 (memory blocks MB), block decoders BD, and drive transistor units 2b. The core driver 9 includes the same CG drivers $CGdrv_0$ to $CGdrv_{n-1}$ as those in FIGS. 6 and 7. The connection between the CG drivers $CGdrv_0$ to $CGdrv_{n-1}$, the selector 91, and CG lines CG is the same as that in FIGS. 6 and 7.

The core driver 9 includes a select SGD driver SGDSEL and an unselect SGD driver SGDUSEL instead of the SGD drivers $SGDdrv_0$ to $SGDdrv_{i-1}$ of FIGS. 6 and 7. The core driver 9 further includes a select SGS driver SGSSEL and an unselect SGS driver SGSUSEL instead of the SGS drivers $SGSdrv_0$ to $SGSdrv_{i-1}$ of FIGS. 6 and 7. A set of select SGD driver SGDSEL, unselect SGD driver SGDUSEL, select SGS driver SGSSEL, and unselect SGS driver SGSUSEL serves all the memory cores MC in the semiconductor memory device 10. Thus, there are total four drivers for the SGD lines SGD and SGS lines SGD, and correspondingly there are four output lines from these drivers. This is contrastive with 2×i of FIGS. 6 and 7. The select SGD driver SGDSEL and select SGS driver SGSSEL generate various voltages to be applied to the select gate lines SGDL and SGSL. The amplitudes of the voltages are different in accordance with the operation of the semiconductor memory device 10 such as writing, reading, and erasure. The voltage for writing may be 5 V. In contrast, the unselect SGD driver SGDUSEL and unselect SGS driver SGSUSEL output the voltage for maintaining the select gate transistor SSTr and SDTr off, which may be 0 V.

The core driver 9 further includes SG line selectors 92 for respective memory cores MC. Each SG line selector 92 includes i transfer transistors 92c, i transfer transistors 92d, i transfer transistors 92e, i transfer transistors 92f, i converters 92a, and i converters 92b. A transfer transistor 92c and a transfer transistor 92d make a pair, and i pairs of transistors 92c and 92d are provided for respective SGD lines $SGD_0$ to $SGD_{i-1}$. The SGD line $SGD_0$ is coupled to the drivers SGDSEL and SGDUSEL via the transistors 92c and 92d for the SGD line $SGD_0$, respectively. Similarly, the SGD line SGD is coupled to the drivers SGDSEL and SGDUSEL via the transistors 92c and 92d for the SGD lines $SGD_X$, respectively.

A transistor 92e and a transistor 92f make a pair, and i pairs of transistors 92e and 92f are provided for respective SGS lines $SGS_0$ to $SGS_{i-1}$. The SGS line $SGS_0$ is coupled to the drivers SGSSEL and SGSUSEL via the transistors 92e and 92f for the SGS line $SGS_0$, respectively. Similarly, the SGS line $SGS_X$ is coupled to the drivers SGSSEL and SGSUSEL via the transfer transistors 92e and 92f for the SGS lines $SGS_X$, respectively.

The gates of the i pairs of transistors 92c and 92e receive the output of the respective i converters 92a. The converters 92a output the voltage for turning on respective pairs of transfer transistors 92c and 92e for a selected string in a selected block MB. To this end, the converters 92a receive the voltage VGSG and predetermined control signals from the controller 5. The predetermined control signals may include an address signal for addressing a selected string and a timing signal for controlling the output timing of the converters 92a, and the like. A converter 92a determined in accordance with the received control signals applies the voltage to the gates of corresponding pair of the transfer transistors 92c and 92e. Each converter 92a includes a logic circuit and a level shifter, and the like, for such functionality.

The gates of the i pairs of transistors 92d and 92f receive the output of the respective i converters 92b. The converters 92b output the voltage for turning on respective pairs of transfer transistors 92d and 92f for a selected string in a selected block MB. To this end, the converters 92b receive the voltage VGSG and predetermined control signals from the controller 5. The predetermined control signals may include an address signal for addressing a selected string and a timing signal for controlling the output timing of the converters 92b, and the like. A converter 92b determined in accordance with the received control signals applies the voltage to the gates of corresponding pair of the transfer transistors 92d and 92f. Each converter 92b includes a logic circuit and a level shifter, and the like, for such functionality.

The operation of the circuit of FIG. 8 will now be described. Specifically, an example where string 0 of the memory core $MC_0$ is selected will be described. When the reading starts, a corresponding block decoder BD is selected which is determined in accordance with the address received by the semiconductor memory device 10 from the outside. The block decoder $BD_0$ is selected in the ongoing context. As a result, to respective gates of the WL drive transistors WDTr, SGDL drive transistor SDDTr, and SGSL drive transistor SSTr of the selected string 0, the voltages to turn them on are applied. Substantially simultaneously, the selector 91 of the memory core $MC_0$ is selected in accordance with a predetermined timing signal and address, and the signal VGCG is applied to the gate of the corresponding transfer transistor 91b. In contrast, the selector 91 of the memory core $MC_1$ stays unselected, and its transfer transistors 91b remain off.

Moreover, the converter 92a of the selected select string 0 turns on the transfer transistors 92c and 92e of the selected string 0. As a result, the select SGD driver SGDSEL is coupled to the SGD line $SGD_0$, and the select SGS driver SGSSEL is coupled to the SGS line $SGS_0$, while the transistors 92d and 92f of the selected string 0 remain off by the converter 92b of the selected string 0. In contrast, the converters 92b of the unselected strings 1 to i−1 turn on the transistors 92d and 92f of the unselected strings 1 to i−1. Moreover, with the converter 92a of the unselected strings 1 to i−1, the transistors 92c and 92e of the unselected strings 1 to i−1 remain off. As a result, the unselect SGD driver SGDUSEL is coupled to the SGD lines $SGD_1$ to $SGD_{i-1}$, and the unselect SGS driver SGSUSEL is coupled to SGS lines $SGS_1$ to $SGS_{i-1}$.

Then at a predetermined timing, the voltage for reading (for example, VAR) is applied to the CG line corresponding to the selected word line WL (for example, the CG line $CG_0$) by the corresponding CG driver CGdrv, and the voltage VREAD is applied to the CG lines corresponding to the unselected word lines WL. The voltages applied to the CG lines CG are applied to the word lines WL of the selected block MB via the selector 91 and transistors WDTr.

The select SGD driver SGDSEL outputs the voltage to be applied to the select gate line SGDL of the selected string, while the select SGS driver SGSSEL outputs the voltage to be applied to the select gate line SGSL of the selected string. The unselect SGD driver SGDUSEL outputs the voltage to be applied to the select gate lines SGDL of the unselected strings, and the unselect SGS driver SGSUSEL outputs the voltage to be applied to the select gate lines SGSL of the unselected strings. The output timings of these drivers SGD-SEL, SGSSEL, SGDUSEL, and SGSUSEL may be simultaneous, or different in accordance with the control type of the reading. Such voltages output from the drivers SGDSEL, SGSSEL, SGDUSEL, and SGSUSEL are applied to specific SGD lines SGD and SGS lines SGS determined in accordance with SG line selectors 92, and then applied to the select gate lines SGDL and SGSL of the selected block MB via the drive transistor unit 2b. Specifically, the output voltage from the select SGD driver SGDSEL is applied to the select gate line $SGDL_0$, that from the select SGS driver SGSSEL to the select gate line $SGSL_0$, that from the unselect SGD driver SGDUSEL to the select gate lines $SGDL_1$ to $SGDL_{i-1}$, and that from the unselect SGS driver SGSUSEL to the select gate lines $SGSL_1$ to $SGSL_{i-1}$. Thus, the select gate transistors SDTr and SSTr only in the selected string 0 in the selected block MB of the memory core $MC_0$ turn on. In the unselected strings 1 to i–1, the transistors SDTr and SSTr remain off. As a result, only the selected memory strings MS in the selected block MB of the memory core $MC_0$ are coupled to the source line SL and respective bit lines BL, and cell current flows in such memory strings MS. In this way, the data of the selected memory cells of the selected memory string $MS_0$ is read.

Thus, in the semiconductor memory device 10 of the first embodiment, the drivers SGDSEL and SGDUSEL cooperate to implement one SGD driver SGDdrv, such as that in FIGS. 6 and 7. Moreover, the drivers SGSSEL and SGSUSEL cooperate to implement one SGS driver SGSdrv, such as that in FIGS. 6 and 7.

Also in any of the writing, erasure, and any other operations, the application of the voltages to specific SGD lines SGD and SGS lines SGS is the same as that of the reading. Therefore, a specific string can be selected during any operation as well as the reading.

As described above, in the semiconductor memory device 10 according to the first embodiment, the drivers SGDSEL, SGDUSEL, SGSSEL, and SGSUSEL and selector 92 drive specific SGD lines SGD and the SGS lines SGS. Thus, the semiconductor memory device 10 needs only four drivers to drive the SGD lines SGD and SGS lines SGS. This number is contrastive with 2×i, which may be the case in FIGS. 6 and 7, and the number of the output lines from the drivers SGDSEL, SGDUSEL, SGSSEL, and SGSUSEL is also reduced at the same rate. For this reason, the area of the core driver 9 to implement the device of FIGS. 1 to 5 is smaller than that in the FIG. 6 or 7 example. In other words, it is possible to implement the semiconductor memory device with a smaller area and a larger margin for interconnect arrangement than those of FIG. 6 or 7 example.

As can be seen, the semiconductor memory device 10 according to the first embodiment includes the selectors 92 which would not be included in the FIG. 6 or 7 configuration. In addition, each selector 92 includes unit structures (a set of transistors 92c, 92d, 92e, and 92f and converters 92a and 92b) for all strings. This may make it appear that the FIG. 8 configuration has a larger area than the FIG. 6 or 7 configuration. The selectors 92, however, only include simple logical circuits and level shifters, and transistors. In contrast, the drivers SGDdrv and SGSdrv of FIGS. 6 and 7 have a large area in general. Therefore, even if the FIG. 8 configuration has the selectors 92, it has a significantly reduced circuit area as the FIG. 8 configuration needs only the divers SGDSEL, SGDUSEL, SGSSEL, and SGSUSEL of the number, which is much smaller than that in FIG. 6 or 7. Furthermore, since it is expected that the larger the capacity of the memory cell array 1, the larger the number i of the strings, the reduction of the area by the semiconductor memory device 10 according to the first embodiment becomes relatively large as the number increases.

Second Embodiment

The second embodiment relates to an example of sharing the select gate lines SGSL as well as the configuration of the first embodiment. The semiconductor memory device 10 of the second embodiment has the same whole configuration and structure as those of the first embodiment (FIGS. 1 to 5). In contrast, the semiconductor memory device 10 of the second embodiment has the configuration to implement the structure of FIGS. 1 to 5 different from that of the first embodiment. Specifically, the semiconductor memory device 10 has the configuration shown in FIG. 9. FIG. 9 illustrates a circuit diagram of the semiconductor memory device 10 according to the second embodiment, and a configuration to implement the semiconductor memory device 10 of FIGS. 1 to 5. All description for the first embodiment applies to all the features for the second embodiment other than those described below.

As shown in FIG. 9, in each block MB, the respective gates of the source-side select gate transistors SSTr in all the strings are commonly coupled to the source-side select gate line $SGSL_0$. According to this, each drive transistor unit 2b includes only one SGSL drive transistor SSDTr instead of i SGSL drive transistors SSDTr, which may be the case in the first embodiment. The transistor SSDTr is coupled between the select gate line $SGSL_0$ and the SGS line SGS.

Moreover, each SG line selector 92 includes a transfer transistor 92g and a transfer transistor 92h instead of the i transfer transistors 92e and i transfer transistors 92f of the first embodiment (FIG. 8). In accordance with this difference, the transfer transistor 92g is coupled between the select SGS driver SGSSEL and the SGS line SGS. The transfer transistor 92h is coupled between the unselect SGS driver SGSUSEL and the SGS line SGS. The respective gates of the transfer transistors 92g and 92h receive outputs of converters 92j and 92l, respectively. The converters 92j and 92l have the same features as the converters 92a and 92b, respectively. Specifically, the converters 92j and 92l in accordance with the control signals from the controller 5 apply voltages to the respective gates of the transfer transistors 92g and 92h, and include a logic circuit and a level shifter, and the like, for such functionality.

In order to implement the semiconductor memory device 10 of FIGS. 1 to 5, for the reading, the current path only through one memory string MS needs to be formed between corresponding one bit line BL and the source line SL. To this end, in the first embodiment, a pair of transistors SDTr and SSTr in each string is both turned on for a selected string, and off for an unselected string. In other words, the coupling and uncoupling of the both ends of a memory string MS to the source line SL and a bit line BL is controlled per string. However, in order to form the current path by only one memory string MS between a bit line BL and the source line SL, only turning on and off the transistor SDTr in each string is sufficient.

For the writing, by applying the voltage for writing to the select gate line SGDL while applying the predetermined write voltage to the word line WL of the selected cell transistor MTr, the voltage of the bit line BL is applied to the selected cell transistor MTr. By setting the bit line BL to be coupled to the voltage determined based on to-be-written data beforehand, the electrons are injected into the charge storage layer IN2b of the selected cell transistor MTr according to the data.

Also for the erasure, the transistors SDTr and SSTr do not need to be controlled individually for each string because the erasure covers the whole block MB and does not require individual selecting of strings.

Thus, the reading, writing and erasure can be performed so long as the transistor SDTr of the two types of select gate transistors SDTr and SSTr can be controlled individually for each string. Therefore, in the second embodiment, the select gate line SGSL is shared within each block MB. When a voltage needs to be applied to the select gate line SGSL, such as during the reading, the transistor $92g$ is turned on. Otherwise, the transistor $92f$ is turned on.

The respective gates of the source-side select gate transistors SSTr in only some strings can also be commonly coupled to a source-side select gate line SGSL instead of all strings. For example, all strings in a block MB are divided into sets of four strings, and the source-side select gate transistors SSTr in each group are connected to each other. General description is that in a block MB, the number of the source-side select gate lines is smaller than that of the drain-side select gate lines.

As described above, the semiconductor memory device 10 of the second embodiment includes four drivers SGDSEL, SGDUSEL, SGSSEL, and SGSUSEL for driving the SGD line SGD and SGS line SGS as in the first embodiment. This allows for the same advantages as those of the first embodiment. In addition, in the second embodiment, the select gate lines SGSL are coupled to each other in each block MB. In accordance with this, each block MB is provided with one SGSL drive transistor SSDTr for the select gate line SGSL, and each memory core MC is provided with one pair of transfer transistors $92g$ and $92h$ and the converters $92j$ and $92l$ for the SGS line SGS. Therefore, the structure for coupling the SGS line SGS to the driver SGSSEL or SGSUSEL is more simple than that in the first embodiment. The configuration of the second embodiment also can perform the reading, writing and erasure without suffering from undesired influences.

Third Embodiment

Figure 10:
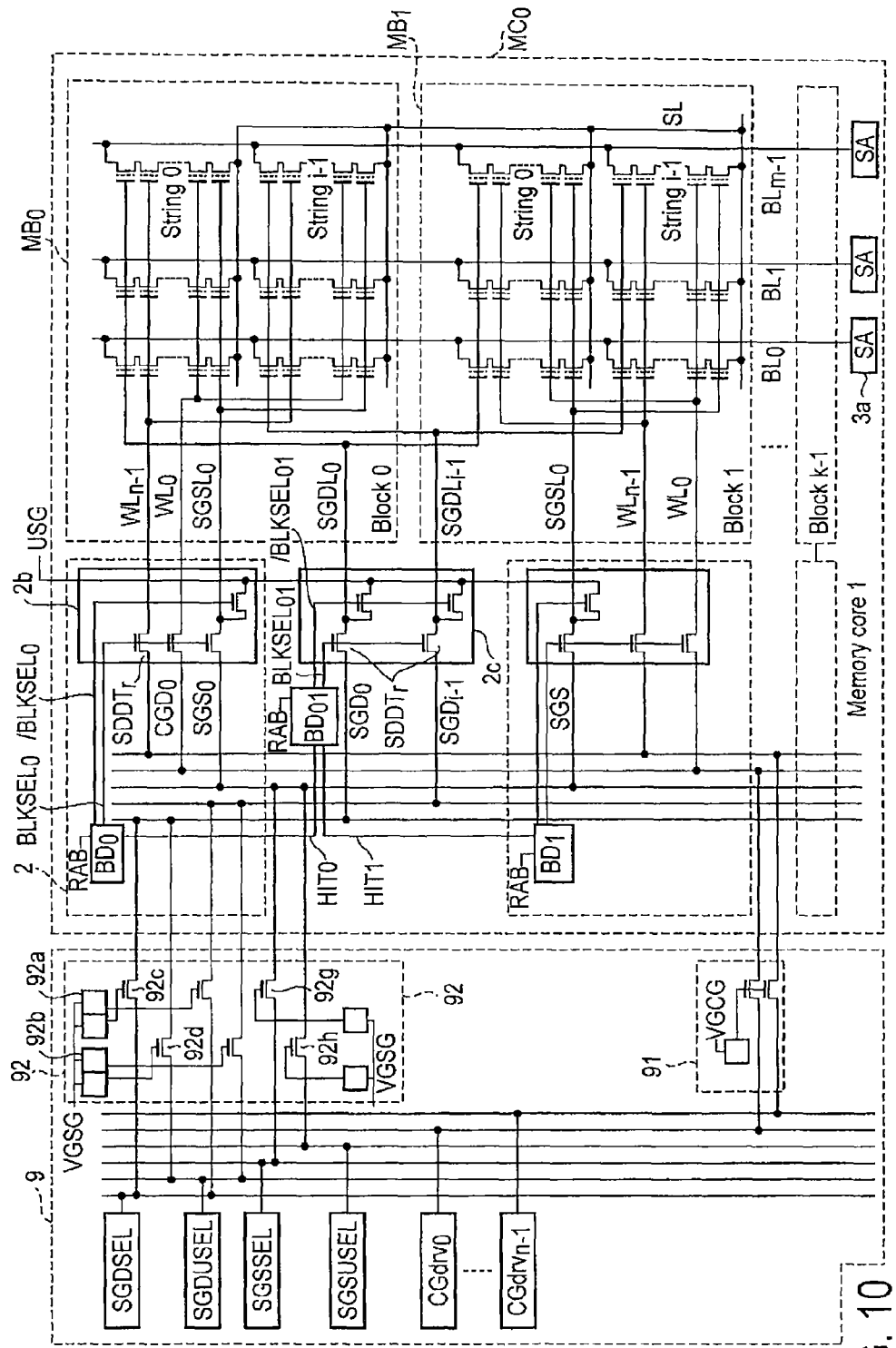
FIG. 10 illustrates a circuit diagram of a semiconductor memory device according to a third embodiment.
Figure 11:
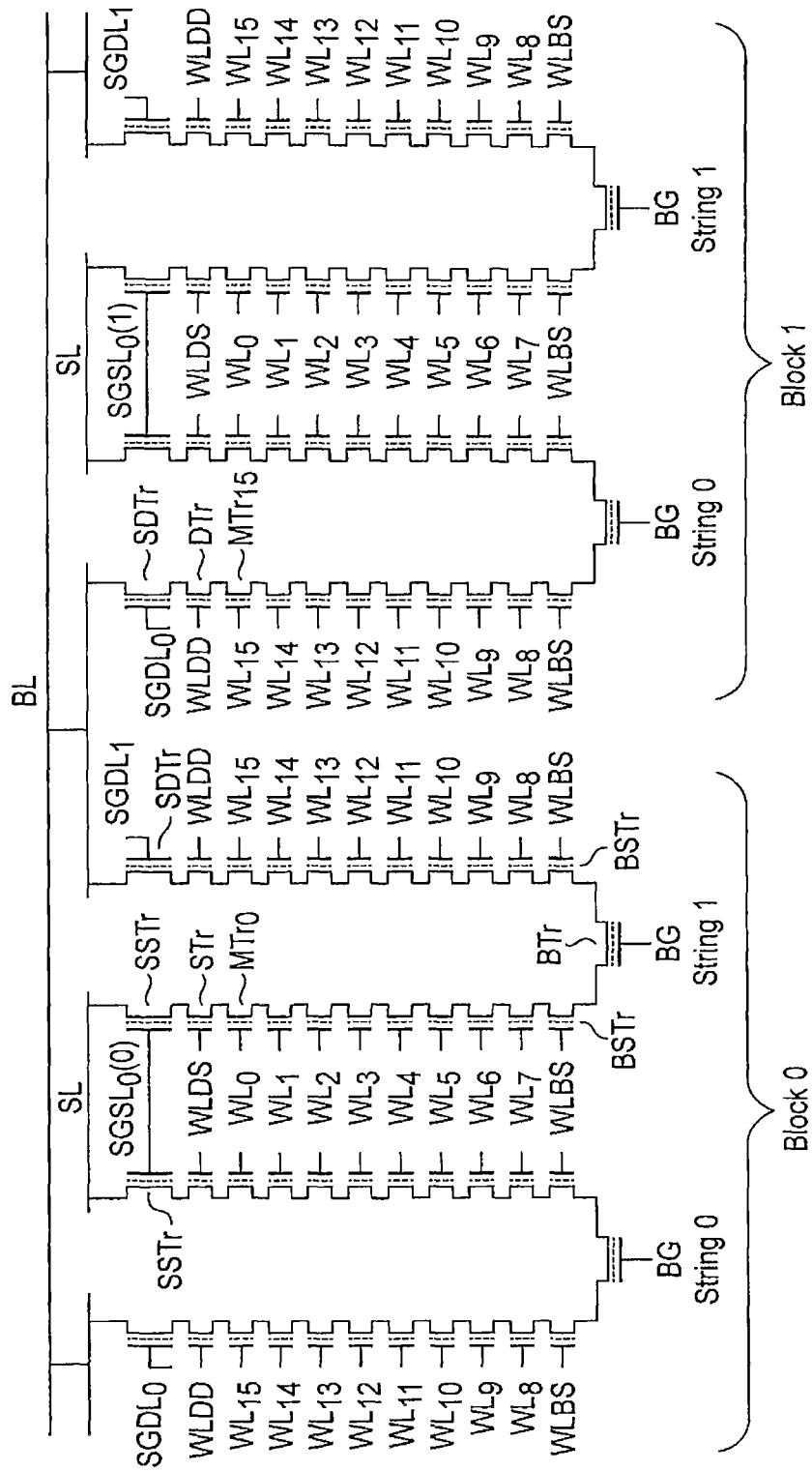
FIG. 11 schematically illustrates a memory block of a third embodiment.

The third embodiment relates to an example of sharing some select gates SGD as well as the configuration of the second embodiment. The semiconductor memory device 10 of the third embodiment has the same whole configuration and structure as those of the first embodiment (FIGS. 1 to 5). In contrast, the semiconductor memory device 10 of the third embodiment has the configuration to implement the structure of FIGS. 1 to 5 different from that of the first embodiment. Specifically, the semiconductor memory device 10 has the configuration shown in FIGS. 10 and 11. FIG. 10 illustrates a circuit diagram of the semiconductor memory device 10 according to the third embodiment, and a configuration to implement the semiconductor memory device of FIGS. 1 to 5. FIG. 11 schematically illustrates the memory block according to the third embodiment. All description for the first embodiment applies to all the features for the third embodiment other than those described below.

As shown in FIG. 10, the third embodiment has the same configuration as the second embodiment for the select gate lines SGSL and SGS line SGS. Specifically, in each block MB, the select gate lines SGSL are coupled to each other and the configuration for selectively electrically coupling the SGS line SGS to the drivers SGSSEL or SGSUSEL is the same as that of the second embodiment.

In contrast, in each memory core, respective drain-side select gate lines $SGDL_0$ of two adjacent blocks MB are coupled to each other. FIG. 10 illustrates only adjacent two blocks $MB_0$ and $MB_1$. Similarly, respective select gates $SGD_X$ of two adjacent blocks MB are coupled to each other. In accordance with sharing the select gate lines SGDL, SGDL drive transistor $SDDTr_0$ is shared between the two adjacent blocks MB which share the select gate line $SGDL_0$, which may be simply referred to as adjacent blocks hereinafter. Similarly, an SGDL drive transistor $SDDTr_X$ is shared between the corresponding pair of adjacent blocks. The row decoder 2 includes drive transistor units $2c$ for respective pairs of adjacent blocks MB. Each transistor unit $2c$ includes i SGDL drive transistors $SDDTr_0$ to $SDDTr_{i-1}$. Instead, the transistor unit $2b$ does not include transistor $SDDTr_0$ to $SDDTr_{i-1}$. The respective first ends of the transistors $SDDTr_0$ to $SDDTr_{i-1}$ are coupled to the select gate lines $SGDL_0$ to $SGDL_{i-1}$, respectively. The respective first ends of the transistors $SDDTr_0$ to $SDDTr_{i-1}$ also receive the signal USG via the respective transistors UTr.

The respective second ends of the transistors $SDDTr_0$ to $SDDTr_{i-1}$ are coupled to the output of the unselect SGD driver SGDUSEL via the respective transfer transistors $92d$, and also coupled to the output of the select SGD driver SGDSEL via the respective transfer transistors $92c$.

The respective gates of the transistors $SDDTr_0$ to $SDDTr_{i-1}$ of the blocks $MB_0$ and $MB_1$ receive a block select signal $BLKSEL_{01}$ from an SGD block decoder $BD_{01}$. The respective gates of the transistors UTr of the blocks $MB_0$ and $MB_1$ receive the signal $/BLKSEL_{01}$ from the SGD block decoder $BD_{01}$. The SGD block decoder $BD_{01}$ receives signals HIT0 and HIT1 from the block decoder $BD_0$ of the block $MB_0$ and the block decoder $BD_1$ of the block $MB_0$, respectively. The signals HIT0 and HIT1 are asserted (made high) when the blocks $MB_0$ and $MB_1$ are selected, respectively, and identical to the block select signals $BLKSEL_0$ and $BLKSEL_1$, respectively. The SGD block decoder $BD_{01}$ outputs the block select signal $BLKSEL_{01}$ when one of the signals HIT0 and HIT0 is asserted. In other words, the SGD block decoder $BD_{01}$ outputs the OR logic of the signals HIT0 and HIT1 as the block select signal $BLKSEL_{01}$. When the block select signal $BLKSEL_{01}$ is asserted, the voltage on the SGD line $SGD_0$ to $SGD1_{i-1}$ is transferred to the select gate lines $SGDL_0$ to $SGDL_{i-1}$, respectively. The same holds true for the remaining pairs of adjacent blocks (for example, blocks $MB_2$ and $MB_3$).

FIG. 11 also shows the same features as those in FIG. 10 although FIG. 11 differs from FIG. 10 in some respects other than sharing of the select gate lines SGDL. First, in FIG. 11, a transistor STr is coupled between each pair of the cell transistor $MTr_0$ and the select gate transistor SSTr. The respective gates of the transistors STr are coupled to respective signal lines WLDS. A transistor DTr is coupled between each pair of the cell transistor $MTr_{15}$ and the drain-side select gate transistor SDTr. The respective gates of the transistors DTr are coupled to respective signal lines WLDD. A transistor BSTr is coupled between each pair of the cell transistor $MTr_7$ and back gate transistor BTr. Another transistor BSTr is also coupled between each pair of the cell transistor $MTr_8$ and back gate transistor BTr. The respective gates of the transistors BSTr are coupled to respective signal lines WLBS.

As in FIG. 10, the respective gates of all the select gate transistors SSTr in the block $MB_0$ are coupled to a source-side select gate line $SGSL_0(0)$. The respective gates of all the select gate transistor SSTr in the block $MB_1$ are coupled to a source-side select gate line $SGSL_0(1)$. The respective gates of the respective select gate transistors SDTr of respective strings 0 of the blocks $MB_0$ and $MB_1$ are commonly coupled to the select gate line $SGDL_0$. Similarly, the respective gates of the respective select gate transistors SDTr of respective strings 1 of the blocks $MB_0$ and $MB_1$ are commonly coupled to the select gate line $SGDL_1$. The same holds true for other strings, and for blocks other than blocks $MB_0$ and $MB_1$.

Thus, a select gate line SGDL is shared between different blocks MB; however it cannot be shared by different strings in the same block MB, because the writing involves transferring potential on a bit line to a specific string only by the corresponding select gate transistor SDTr, as opposed to the reading. Specifically, assume as an example that the select gate line SGDL is shared by the strings 0 and i−1 of the same block $MB_0$, then writing would undesirably occur to two cell transistors MTr which share a word line WL in the two strings.

Figure 14:
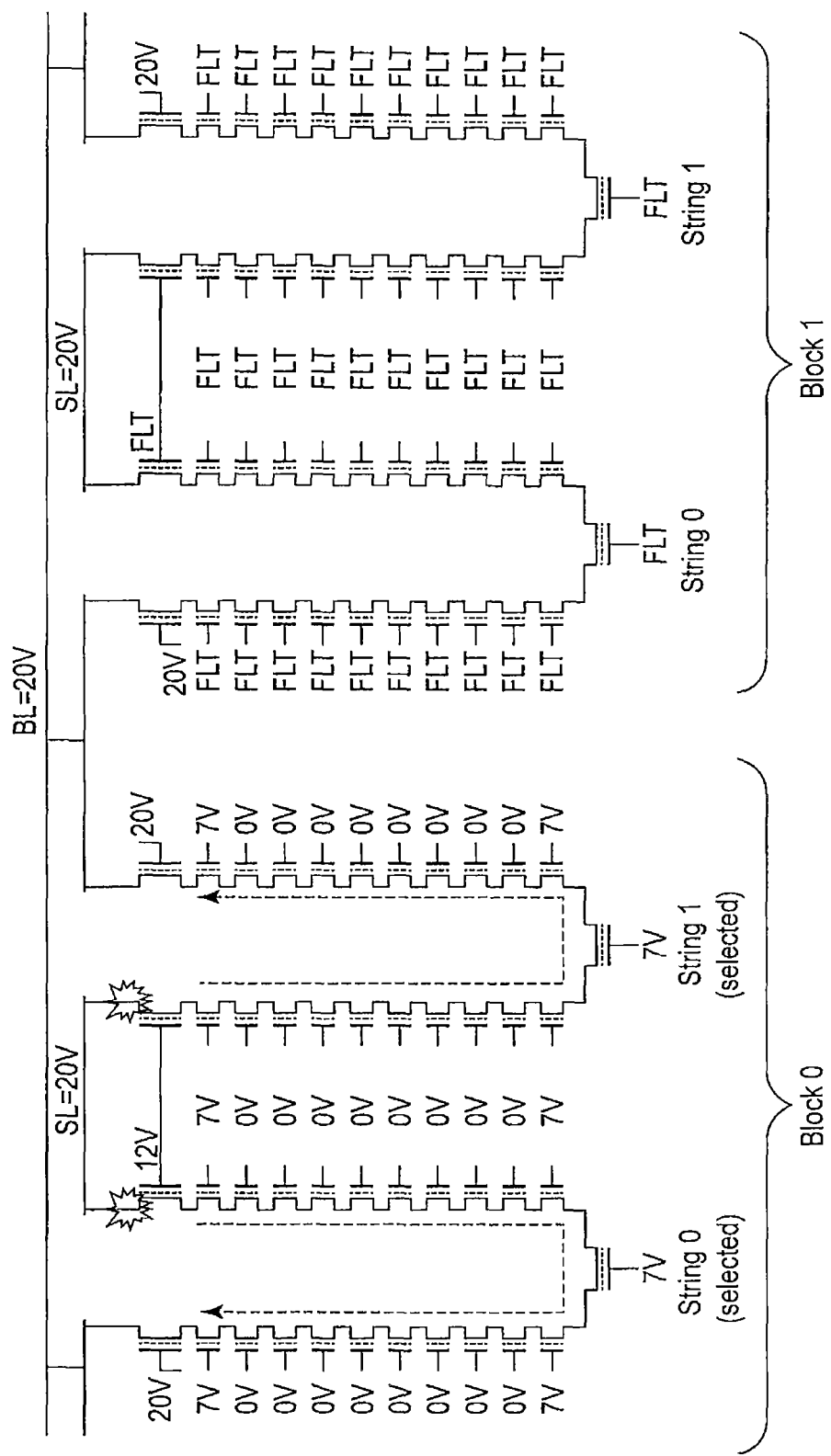
FIG. 14 illustrates voltages at principle nodes during erasure according to the third embodiment.

In contrast, according to the third embodiment, the reading, writing, and erasure are possible with the same selectivity as conventional techniques. FIGS. 12 to 14 illustrate the voltages at principle nodes during the reading, writing, and erasure in the semiconductor memory device 10 of the third embodiment, respectively. FIG. 12 illustrates an example of reading of the cell transistor $MTr_0$ of string 0 of the block $MB_0$. As shown in FIG. 12, all the select gate transistors SSTr in the selected block $MB_0$ receive the voltage VSG at their gates and turn on, and all the select gate transistors SSTr in the unselected block $MB_1$ receive 0 V at their gates and remain off. Moreover, the respective select gate transistors SDTr of string 0 in the adjacent blocks $MB_0$ and $MB_1$ receive the voltage VSG at their gates and turn on. In contrast, the respective select gate transistors SDTr in other strings receive 0 V at their gates and remain off. Furthermore, only the selected cell transistors $MTr_0$ in the selected block $MB_0$ receive suitable read voltage VSEL, such as voltage VAR, VBR, and VCR and the like, at their gates. In contrast, the unselected cell transistors MTr and the transistors STr, DTr, BSTr, and BTr in the selected block $MB_0$ receive voltage VREAD at their gates and turn on. The cell transistors MTr, and the transistors STr, DTr, BSTr, and BTr in the unselected block $MB_1$ receive voltage FLT at their gates and remain off.

As a result of such voltage application, between the bit line BL and source line SL, only the current path via the selected string 0 in the selected block $MB_0$ is formed. The select gate transistor SSTr turns on also in string 1 in the selected block $MB_0$; however, the select gate transistor SDTr of the unselected string 1 in the selected block $MB_0$ remains off, and therefore no current path is formed between the bit line BL and source line SL via unselected string 1 in the selected block $MB_0$. Moreover, the select gate transistor SDTr turns on also in string 0 in the unselected block $MB_1$; however, the select gate transistor SSTr of string 0 in the unselected block $MB_1$ remains off, and therefore no current path is formed between the bit line BL and source line SL via string 0 in the unselected block $MB_1$. Therefore, the voltage according to the data stored in the selected cell transistor $MTr_0$ of the selected string 0 of the selected memory block $MB_0$ (for example, 1.6 or 1.1 V) appears on the bit line BL.

FIG. 13 illustrates an example of writing to the cell transistor $MTr_0$ of string 0 of the block $MB_0$. As shown in FIG. 13, all the select gate transistors SSTr in the selected and unselected blocks MB receive 0 V at their gates and remain off. The respective select gate transistors SDTr of string 0 in the adjacent blocks $MB_0$ and $MB_1$ receive voltage VSGD at their gates. In contrast, the select gate transistors SDTr of other strings receive 0 V at their gates and remain off. Only the selected cell transistor $MTr_0$ in the selected block $MB_0$ receives the program voltage VPGM at its gate. In contrast, the unselected cell transistors MTr and the transistors BSTr and BTr in the selected block $MB_0$ receive voltage VPASS and turn on. The transistors STr and DTr in the selected block $MB_0$ receive voltage VGP and turn on. In the unselected block $MB_1$, the cell transistors MTr and the transistors STr, DTr, BSTr, and BTr receive voltage FLT at their gates and remain off. Moreover, the voltage for writing (for example, 2.2 V) is applied to the source line SL, and the voltage according to the data to be written (for example, 3.8 or 1.5 V) is applied to the bit line BL.

As a result of such voltage application, only in the selected string 0 in the selected block $MB_0$, the voltages required for writing are applied to the respective gates of the transistors MTr, SDTr, SSTr, STr, DTr, BSTr, and BTr. Although the voltages for writing are applied to the bit line BL and source line SL in the unselected string 1 of the selected block $MB_0$, the voltage VSGD required for writing is not applied to the select gate line SGDL. The voltage required for writing is applied to the select gate line SGDL also in string 0 of the unselected block $MB_1$; however its transistors MTr, STr, DTr, and BSTr remain off, and therefore the writing to string 0 of the unselected block $MB_1$ does not occur. In this way, the writing occurs only in selected string 0 in the selected block $MB_0$.

FIG. 14 illustrates an example of erasure of the block $MB_0$. As shown in FIG. 14, all the select gate transistors SSTr in the selected block $MB_0$ receive the voltage for erasure (for example, 12 V) at their gates. All the select gate transistors SDTr in the selected block $MB_0$ receive the voltage for erasure (for example, 20 V) at their gates. In the selected block $MB_0$, all the word lines WL are set to 0 V, and the signal lines WLDS, WLDD, and WLBS and back gate lines BG are set to the voltage for erasure (for example, 7 V). The bit line BL and source line SL are also set to the voltage for erasure (for example, both 20 V). As a result of such voltage application, the data in the selected memory block $MB_0$ is erased.

In contrast, all the select gate transistors SDTr of the unselected block $MB_1$, which makes a pair with the block $MB_0$, also receive the voltage for erasure at their gates; however, in the unselected block $MB_1$, all the select gate transistors SSTr receive voltage not for erasure (for example, voltage FLT), and the word lines WL, signal lines WLDS, WLDD, and WLBS and back gate lines BG also receive voltage not for erasure (for example, voltage FLT). For this reason, the data in the unselected block $MB_1$ is not erased.

As described above, the semiconductor memory device 10 of the third embodiment includes four drivers SGDSEL, SGDUSEL, SGSSEL, and SGSUSEL for driving the SG lines as in the first embodiment. This allows for the same advantages as those of the first embodiment. The semiconductor memory device 10 of the third embodiment also has the select gate lines SGSL coupled to each other in each block MB as in the second embodiment. This allows for the same advantages as those of the second embodiment. Moreover, the same string of the adjacent blocks MB share the select gate line SGDL in the semiconductor memory device 10 of the third embodiment. On the basis of this, the SGDL drive transistor SDDTr is also shared, which results in a simplified structure of the block decoder 2. The configuration of the third embodiment also can perform the reading, writing and erasure without suffering from undesired influences.

Fourth Embodiment

Figure 15:
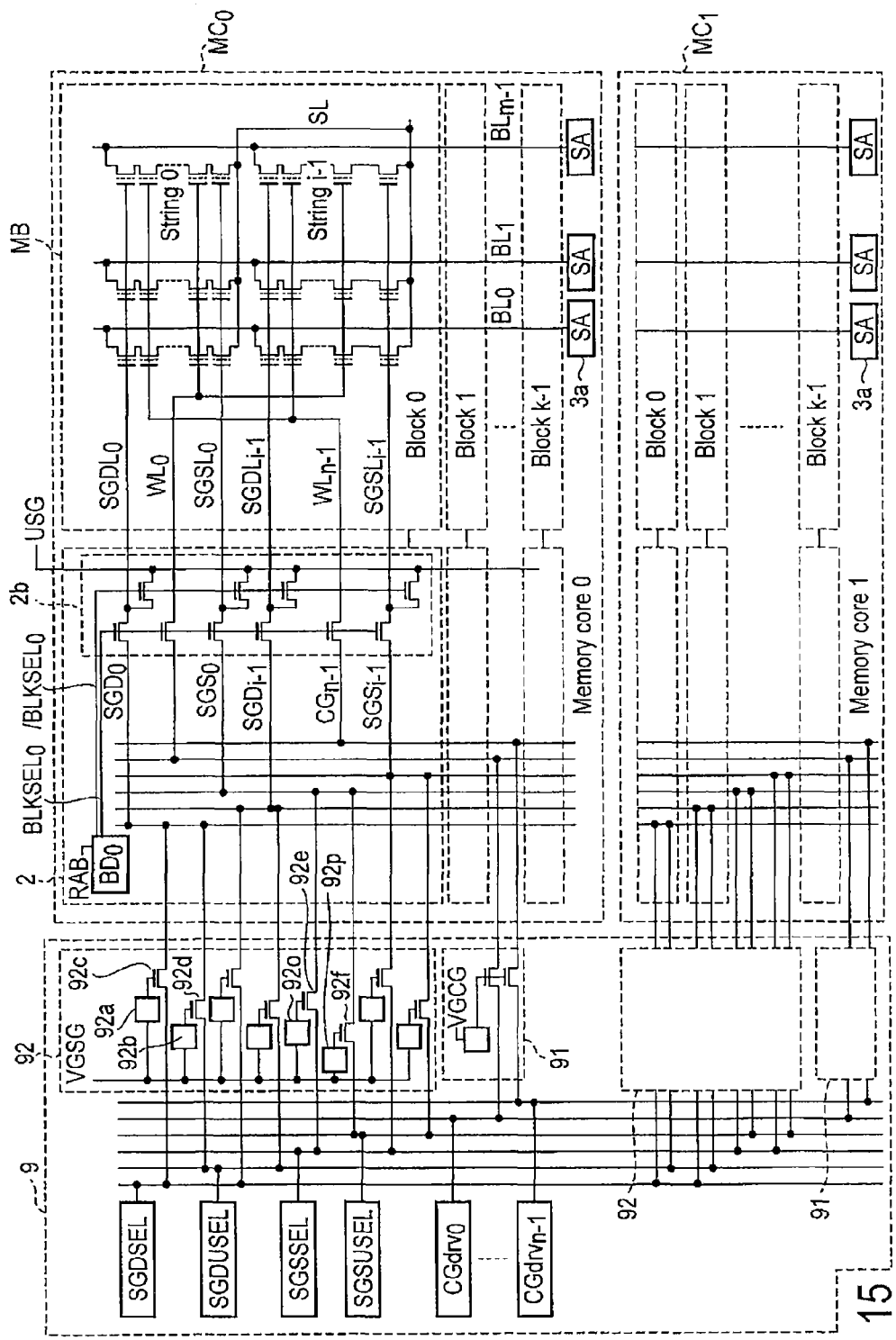
FIG. 15 illustrates a circuit diagram of a semiconductor memory device according to a fourth embodiment.

The fourth embodiment is based on the first embodiment, and relates to individual control of the drivers SGDSEL, SGDUSEL, SGSSEL, and SGSUSEL, and the SGD line SGD and SGS line SGS for each string. The semiconductor memory device 10 of the fourth embodiment has the same whole configuration and structure as those of the first embodiment (FIGS. 1 to 5). In contrast, the semiconductor memory device 10 of the fourth embodiment has the configuration to implement the structure of FIGS. 1 to 5 different from that of the first embodiment. Specifically, the semiconductor memory device 10 has the configuration shown in FIG. 15. FIG. 15 illustrates a circuit diagram of the semiconductor memory device 10 according to the fourth embodiment, and a configuration to implement the semiconductor memory device 10 of FIGS. 1 to 5. All description for the first embodiment applies to all the features for the fourth embodiment other than described below.

As shown in FIG. 15, the respective gates of the i transfer transistors 92e receive the respective outputs of the i converters 92o, respectively, instead of the outputs of the converters 92a in the first embodiment. Each converter 92o receives the signal VGSG. One of the i converters 92o determined in accordance with the signal VGSG outputs the signal.

The respective gates of the i transfer transistors 92f receive the respective outputs of the i converters 92p, respectively, instead of the outputs of the converters 92b in the first embodiment. Each converter 92p receives the signal VGSG. One of the i converters 92p determined in accordance with the signal VGSG outputs the signal.

Such configuration enables independent control of connection between the drivers SGDSEL and SGDUSEL for the SGD lines SGD and connection between the drivers SGSSEL and SGSUSEL for the SGS lines SGS for each string. This is contrastive to the first embodiment which only has an option to apply the voltage for selection to both the SGD line SGD and SGS line SGS or an option to apply the voltage for non-selection to both the SGD line SGD and SGS line SGS. As a result, desired voltages can be applied independently to the select gate lines SGDL and SGSL of a selected string for the reading, writing, or erasure. This enables application of the output of the select SGD driver SGDSEL to the SGD line SGD and the output of the unselect SGS driver SGSUSEL to the SGS line SGS for a selected string, for example. This in turn enables erasure via gate induced drain leakage current (GIDL), for example.

As described above, the semiconductor memory device 10 of the fourth embodiment includes four drivers SGDSEL, SGDUSEL, SGSSEL and SGSUSEL for driving the SGD line SGD and SGS line SGS as in the first embodiment. This allows for the same advantages as those of the first embodiment. Moreover, the fourth embodiment enables application of the output of the driver for selection (i.e., SGDSEL or SGSSEL) or the driver for un-selection (i.e., SGDUSEL or SGSUSEL) selected independently to each of the select gate lines SGDL and SGSL for each string. This can realize control with high flexibility.

Fifth Embodiment

The fifth embodiment relates to structures of the semiconductor memory device 10 according to the first to fourth embodiments, and has the same circuit configuration as that of any of the first to fourth embodiments.

Figure 16:
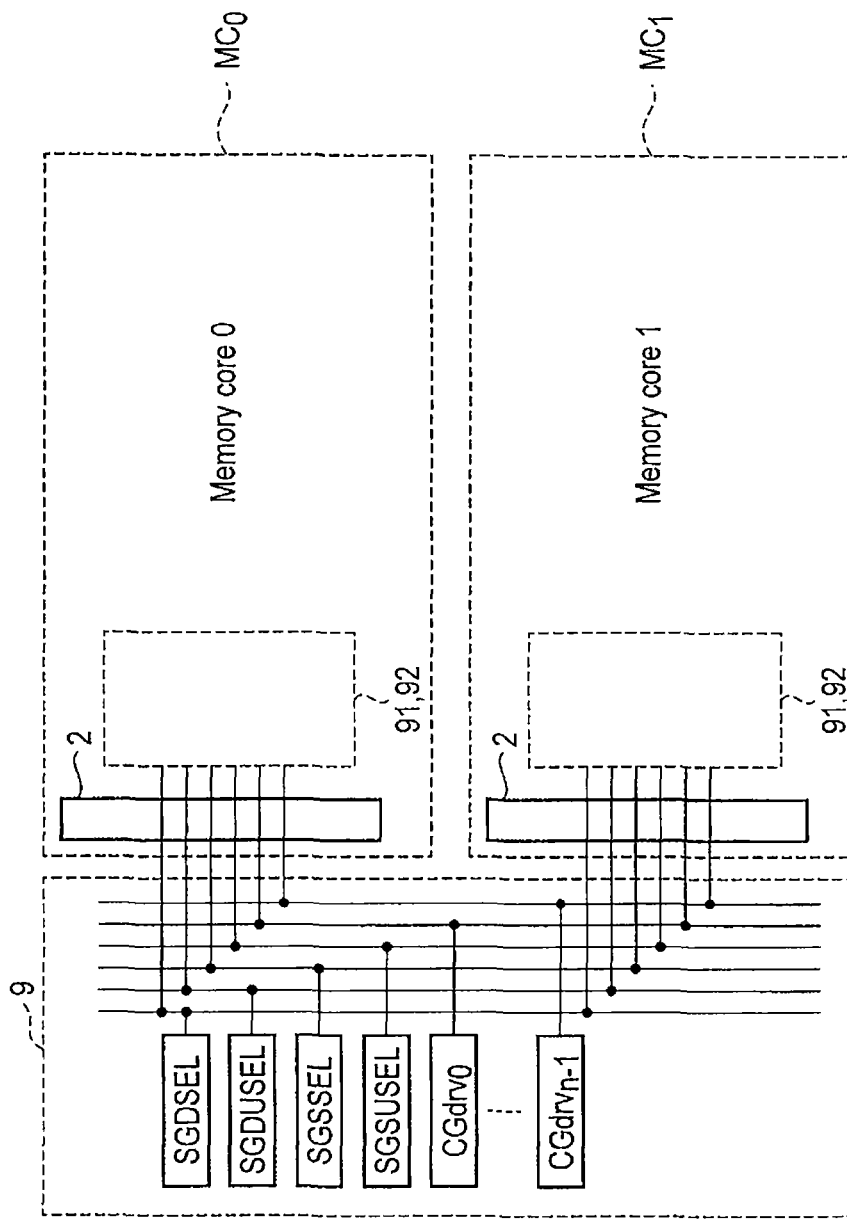
FIG. 16 conceptually illustrates a semiconductor memory device according to a fifth embodiment.

FIG. 16 conceptually illustrates the semiconductor memory device 10 according to the fifth embodiment. In FIG. 16, components other than the selector 91 and SG line selector 92 in the memory core MC are omitted for the purpose of simplification. The memory core MC, however, has the same components and connection as those of the first to fourth embodiments. The details of the selector 91 and SG line selector 92 are also the same as those of any of the first to fourth embodiments. The selector 91 and SG line selector 92 underlie the memory core MC along the stack direction.

FIG. 17 illustrates a sectional view of the semiconductor memory device 10 according to the fifth embodiment. As shown in FIG. 17, the semiconductor memory device 10 according to the fifth embodiment includes transistors Tr, interconnect layers M0 and M1, and plugs CS and V1 for implementing the selector 91 and SG line selector 92 between a substrate sub and the back gate line BG instead of the structure of FIG. 2. The transistors Tr are included in the selector 91 and SG line selector 92. The transistors Tr are formed in active regions AA in the surface of the substrate sub, and have their own source/drain areas (not shown) and gate electrodes GC, and the like. The interconnect layer M0 lies above the substrate sub. The interconnect layer M0 is coupled to the gate electrodes GC and the active regions AA (source/drain areas) via conductive plugs CS. The interconnect layer M1 lies above the interconnect layer M0. The interconnect layer M1 is coupled to the interconnect layer M0 via the plugs V1.

The transistors Tr, interconnect layers M0 and M1, and plugs CS and V1, and the like, which configure peripheral circuits (for example, the block decoder BD), are formed also in a peripheral circuit area. The interconnect layers M0 and M1 lie over the memory core area and peripheral circuit area, and electrically couple the peripheral circuit area and memory core area. In the peripheral circuit area, the interconnect layer M1 is electrically coupled to the top interconnect layer D2 via a plug CP0, an interconnect layer D0, and a plug CP1, an interconnect layer D1, and a plug CP2. The interconnect layers D0 and D1 serve as the source line SL and bit line BL in the memory core area, respectively. The space without components in FIG. 17 is buried with interlayer insulator.

FIGS. 18 to 21 conceptually illustrate perspective view examples of the semiconductor memory device 10 according to the fifth embodiment. FIGS. 18 to 21 illustrate only the driver SGDSEL among the drivers SGDSEL, SGDUSEL, SGSSEL, and SGSUSEL; however the similar structure is formed for the remaining drivers. Moreover, FIGS. 18 to 21 only illustrate the SG line selector 92 among SG line selector 92 and the selector 91; however the selector 91 is formed similarly.

FIG. 18 illustrates an example with the SG line selector 92 (and selector 91) between the block decoder BD and SGD drive transistor SDDTr. As shown in FIG. 18, the SG line selector 92 underlies the memory block MB. The path for the driver SGDSEL output, which may be referred to as the output SGDSEL, is directed from the peripheral circuit area over the block decoder BD to just before the memory core (block MB) by the interconnect layers D0, D1, and D2, and it is further directed to above the SG line selector 92 by the interconnect layer M1. The interconnect layer M1 for the path of the output SGDSEL is coupled to one end (i.e., one of the source/drain areas) of the transfer transistor 92c by the plug V1, interconnect layer M0, and plug CS. The gate of the transfer transistor 92c is coupled to a source/drain area of a transistor which is part of the converter 92a by the interconnect layer M0, for example. The path from the other end (i.e., the other of the source/drain areas) of the transfer transistor 92c, or SGD line SGD, is directed to above the drive transistor SDDTr by the plug V1, interconnect layer M0, plug CS, and interconnect layer M1. The drive transistor SDDTr is located outside the block MB to sandwich the block MB with the block decoder BD. The interconnect layer M1 for the SGD line SGD is coupled to one end of the drive transistor SDDTr by the plug V1, interconnect layer M0, and plug CS. The path from the other end of the drive transistor SDDTr, or the path for the select gate line SGDL, is drawn into the block MB. The block select signal BLKSEL (and /BLKSEL) is directed by the interconnect layer M0, for example, from the block decoder BD to the drive transistor SDDTr, where it is coupled to the gate of the drive transistor SDDTr. Thus, the signal BLKSEL (and /BLKSEL) needs to be directed from the peripheral circuit area via below the memory block MB to where the drive transistor SDDTr lies. Note that the path for the output SGDSEL and that for the SGD line SGD do not necessarily need to be implemented by the interconnect layer M1. They may be implemented by the interconnect layer M0 or the combination of the interconnect layers M0 and M1.

Figure 19:
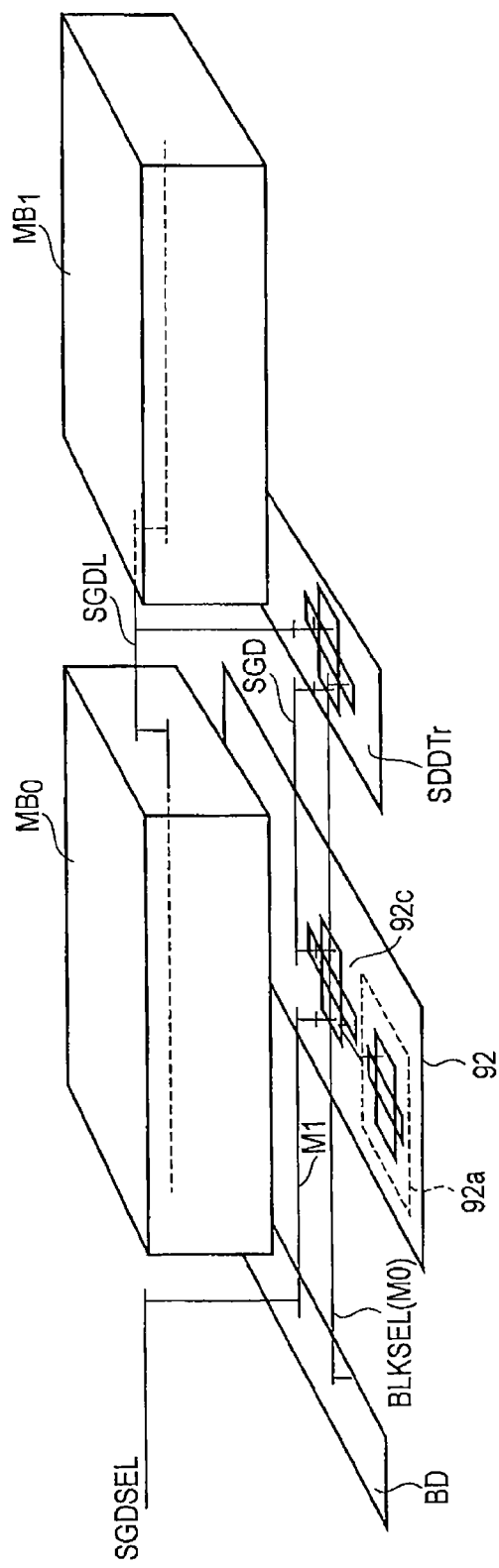

FIG. 19 illustrates an example where the FIG. 18 example is applied to the third embodiment. As shown in FIG. 19, the drive transistor SDDTr is located between blocks $MB_0$ and $MB_1$. The path for the select gate line SGDL is drawn into the blocks $MB_0$ and $MB_1$ from the drive transistor SDDTr.

Figure 20:
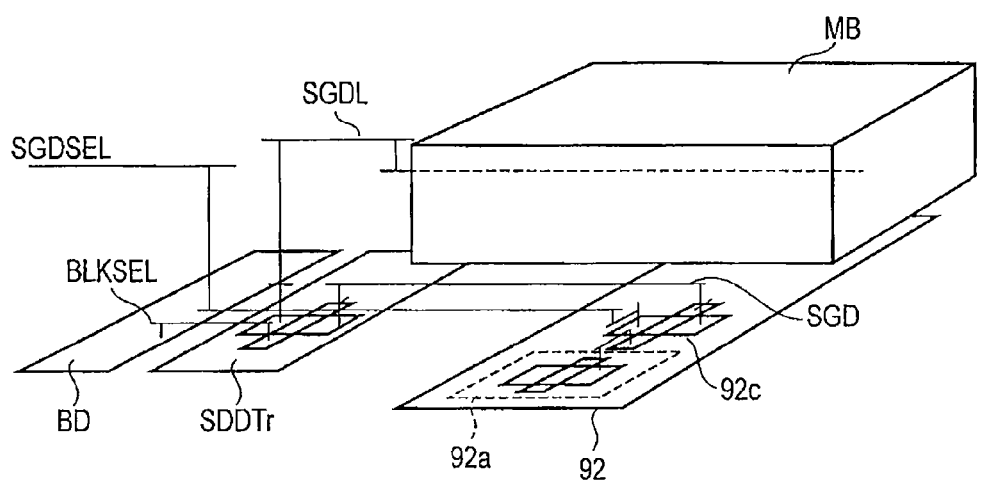

FIG. 20 illustrates an example where the drive transistor SDDTr is located between the block decoder BD and SG line selector 92 (and selector 91) as opposed to FIGS. 18 and 19. As shown in FIG. 20, the path for the output SGDSEL may be directed above the SGD drive transistor SDDTr to one end of the transfer transistor 92c by the interconnect layer M1. The SG line selector 92 underlies the block MB. The path from the other end of the transfer transistor 92c, or the path for the SGD line SGD, is directed to above the drive transistor SDDTr by the interconnect layer M1, where it is coupled to one end of the drive transistor SDDTr. The path from the other end of the transfer transistor 92c, or, the path for the select gate line SGDL, is drawn into the block MB.

Figure 21:
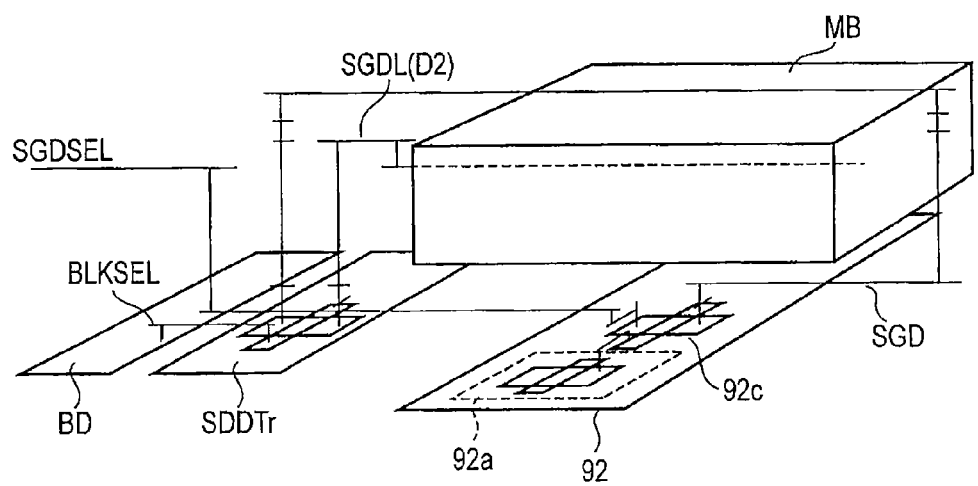

FIG. 21 differs from FIG. 20 in the path for the SGD line SGD. As shown in FIG. 21, the path for the SGD line SGD is directed from the other end of the transfer transistor 92c to outside the block MB in the direction away from the drive transistor SDDTr. Then, the path for the SGD line SGD is pulled up to above the block MB by a plug, for example, and runs above the block MB to the opposite side of the block MB by the interconnect layer D2. The path for the SGD line SGD is then coupled to one end of the drive transistor SDDTr.

The structures of FIGS. 18 to 21 can also be combined.

As described above, according to the semiconductor memory device 10 of the fifth embodiment, the selector 91 and SG line selector 92 underlie the block MB. This can avoid inclusion of the selector 91 and SG line selector 92 in the peripheral circuit area in the first to fourth embodiments, and prevent increase of the area of the semiconductor memory device 10. Moreover, according to the fifth embodiment, the advantages of the first to fourth embodiments which are combined to the fifth embodiment can also be obtained.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
a plurality of first memory units each comprising a first transistor, first to $n^{th}$ memory cell transistors (n being a natural number), and a second transistor which are serially coupled between a first end and a second end;
a plurality of first lines coupled to the first transistors;
a plurality of second lines coupled to the second transistors;
a bit line coupled to first ends of the first memory units;
a row decoder coupled to the first lines and the second lines;
a first driver configured to output voltage to a selected one of the first lines;
a second driver configured to output voltage to unselected of the first lines;
a third driver configured to output voltage to a selected one of the second lines;
a fourth driver configured to output voltage to unselected of the second lines;
a selector coupled to the row decoder, the selector being configured to
selectively individually couple the first line of each of the first memory units to the first or second driver, and
selectively individually couple the second line of each of the first memory units to the third or fourth driver.

2. The device of claim 1, wherein
the first driver outputs one of voltages required to be applied to the first transistor of the selected memory unit in accordance with operation of the device,
the third driver outputs one of voltages required to be applied to the second transistor of the selected memory unit in accordance with operation of the device,
the second driver outputs voltage configured to maintain the unselected first transistors off, and
the fourth driver outputs voltage configured to maintain the unselected second transistors off.

3. The device of claim 1, wherein the selector:
couples the respective first and second lines of the selected memory unit to the first and third drivers, respectively, and
couples the respective first and second lines of the unselected memory units to the second and fourth drivers, respectively.

4. The device of claim 3, wherein the selector comprises: for each of the first memory units,
a first switch configured to selectively couple the first driver and the first line;
a second switch configured to selectively couple the second driver and the first line;
a third switch configured to selectively couple the third driver and the second line; and
a fourth switch configured to selectively couple the fourth driver and the second line.

5. The device of claim 4, wherein the selector is configured, for each of the first memory units, to turn on or off the first and third switches collectively, and turn on or off the second and fourth switches collectively.

6. The device of claim 4, wherein the selector is configured, for each of the first memory units, to turn on or off the first and third switches individually, and turn on or off the second and fourth switches individually.

7. The device of claim 1, wherein
the respective gate electrodes of at least two of the second transistors are mutually coupled, and
the selector couples the mutually coupled gate electrodes of the second transistors to the third driver selectively, and to the fourth driver selectively.

8. The device of claim 7, wherein
for each of the first memory units, the selector comprises:
a first switch configured to selectively couple the first driver and the first line; and
a second switch configured to selectively couple the second driver and the first line, and
the selector further comprises:

a third switch configured to selectively couple the third driver and the mutually coupled gate electrodes of the second transistors; and a fourth switch configured to selectively couple the fourth driver and the mutually coupled gate electrodes of the second transistors.

9. The device of claim 1, further comprising second memory units each comprising a first transistor, memory cell transistors, and a second transistor which are serially connected between a first end and a second end, wherein memory cell transistors each of which is one of the memory cell transistors of each of the second memory units have their gate electrodes coupled to each other, the second memory units are commonly coupled to the bit line at their respective first ends, the gate electrode of the first transistor of one of the memory units and the gate electrode of the first transistor of one of the second memory units are mutually coupled, and the selector selectively couples the mutually coupled gate electrodes of the first transistors to the first driver, and selectively couples the mutually coupled gate electrodes of the first transistors to the second driver.

10. The device of claim 9, wherein the memory units are included in a first block, the second memory units are included in a second block, and each of the first and second blocks are the unit of data erasure.

11. The device of claim 1, wherein the selector comprises an interconnect and a transistor between a substrate and the memory unit.

* * * * *